United States Patent
Shiga et al.

(10) Patent No.: US 6,888,764 B2
(45) Date of Patent: May 3, 2005

(54) SEMICONDUCTOR DEVICE INCLUDING SEMICONDUCTOR MEMORY

(75) Inventors: Hitoshi Shiga, Kanagawa (JP); Tadayuki Taura, Kanagawa (JP); Shigeru Atsumi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 291 days.

(21) Appl. No.: 10/231,283

(22) Filed: Aug. 30, 2002

(65) Prior Publication Data

US 2003/0072204 A1 Apr. 17, 2003

(30) Foreign Application Priority Data

Aug. 31, 2001 (JP) ....................................... 2001-262884

(51) Int. Cl.[7] .............................................. G11C 7/00
(52) U.S. Cl. .............. 365/200; 365/185.22; 365/185.09
(58) Field of Search ........................... 365/200, 185.22, 365/185.09

(56) References Cited

U.S. PATENT DOCUMENTS

| 6,072,719 A | 6/2000 | Tanzawa et al. |
| 6,078,525 A | 6/2000 | Kuriyama et al. |
| 6,208,570 B1 | 3/2001 | Brown et al. |
| 6,262,916 B1 | 7/2001 | Kuriyama et al. |

FOREIGN PATENT DOCUMENTS

| JP | 9-288899 | 11/1997 |
| KR | 1997-0072440 | 11/1997 |
| KR | 2000-0066284 | 11/2000 |

Primary Examiner—Connie C. Yoha
(74) Attorney, Agent, or Firm—Oblon, Spivak, McClelland, Maier & Neustadt, P.C.

(57) ABSTRACT

A semiconductor device has an address counter to output, in a first mode, a first block address whereas, in a second mode, a second block address selected from a block-address space two times larger than a block-address space corresponding to memory blocks, the memory blocks and at least one redundant block being included in a memory section, and a block-selection controller, in the second mode, one of the memory blocks, which corresponds to the output of the address counter, when the most significant value of the second block address as the output of the address counter is at a first level whereas select the redundant block while the memory blocks are inhibited from selection, when the most significant value is at a second level.

11 Claims, 19 Drawing Sheets

50A

SEMICONDUCTOR DEVICE INCLUDING SEMICONDUCTOR MEMORY

CROSS REFERENCE TO RELATED APPLICATIONS

This application is based upon and claims the benefit of priority from the prior art Japanese Patent Application No. 2001-262884 filed on Aug. 31, 2001, the entire contents of which are incorporated by reference.

BACKGROUND OF THE INVENTION

The present invention relates to a semiconductor device including a semiconductor memory having memory cells and redundant cells, with a function of testing the semiconductor memory.

Semiconductor memories have redundant memory cells in addition to memory cells whose memory capacity depends on addresses and the number of I/O lines. The memory cells will be replaced with the redundant memory cells to maintain high yields, if defective caused in several manufacturing processes.

Explained below is a known semiconductor device including a semiconductor memory, with a function of testing the semiconductor memory.

The known semiconductor device has a flash memory, as the semiconductor memory, with several blocks of memory cells, data being erasable per block. Replacement of a defective memory cell with a redundant memory cell is thus actually performed by replacing a block including the defective memory cell with a redundant block of redundant memory cells.

As shown in FIG. 13, a flash memory is equipped with a memory-cell array 3, a memory section 2 having a column decoder 4 and a row decoder 5, a sense amplifier 7, a controller 10 having an address controller 11 and a data controller 13, a command interface 14, an automated-operation controller 16 and a power controller 18.

The memory section 2 is controlled by the address controller 11 based on entered addresses. It is further controlled by the data controller 13 in response to a chip-enable signal CEB and a write-enable signal WEB. Data entered via I/O are sent to the memory section 2 through the data controller 13; conversely, data retrieved by the sense amplifier 2 from the memory section 2 are output to I/O through the data controller 13. Commands entered via I/O are sent to the automated-operation controller 16 and/or the power controller 18 through the command interface 14.

The power controller 18 controls power supplied to the memory section 2. The automated-operation controller 16 has a function of automatically erasing data in several blocks, for example. The automatic erasing function is to verify whether data have been erased from memory cells (erasure verification) and control the erasing operation until all cells pass erasure-verification testings.

The redundant blocks in the known semiconductor device have no particular addresses because such addresses are not necessary for replacements of defective memory cells with the redundant blocks.

Therefore, in addition to the automatic erasing function to the memory blocks, the known semiconductor device requires a further automated operation in test mode with data replacements in a replacement-address memory storing addresses to be replaced and inevitable selection of redundant blocks for redundant-block automatic writing/erasing testings.

In other words, the known semiconductor device requires more than one block-writing/erasing-verification testing to all blocks and thus requires much time for such testings.

SUMMARY OF THE INVENTION

A semiconductor device according to the first aspect of the present invention includes: an address counter to output, in a first mode, a first block address selected from a first block-address space corresponding to a plurality of memory blocks, the memory blocks and at least one redundant block being included in a memory section, whereas, in a second mode, a second block address selected from a second block-address space two times larger than the first block-address space; a memory to store addresses of the memory blocks and an address of the redundant block with which any one of the memory blocks is to be replaced when defective; a memory-to-redundant block replacement decider to output an agreement signal when the output of the address counter and the address of the redundant block stored in the memory are equal to each other; and a block-selection controller to select, in the second mode, one of the memory blocks, which corresponds to the output of the address counter, when the most significant value of the second block address as the output of the address counter is at a first level whereas select the redundant block while the memory blocks are inhibited from selection, when the most significant value is at a second level, and in the first mode, select one of the memory blocks, which corresponds to the output of the address counter, when the agreement signal is not output from the memory-to-redundant block replacement decider whereas select the redundant block with which one of the memory blocks, which corresponds to the output of the address counter, is to be replaced based on the output of the memory, while the memory blocks are inhibited from selection, when the agreement signal is output from the memory-to-redundant block replacement decider.

A semiconductor device according to the second aspect of the present invention includes: at least one redundant word or bit line to be used for memory-cell replacements; a memory to store address information to be used for replacing a memory-cell word or bit line with the redundant word or bit line when the memory-cell word or bit line is defective; an address counter; and an automated-operation controller to select memory cells one by one in accordance with the output of the address counter, perform a writing or an erasing procedure to each memory cell, the procedure being automatically terminated when the procedure is complete for all addressed memory cells, the writing and the erasing procedures being performed to all memory cells, including redundant memory cells, selected in succession in test mode.

A semiconductor device according to the third aspect of the present invention includes: a plurality of memory columns connected to at least one memory cell and at least one redundant column; a memory to store information on which memory column has been replaced with the redundant column; a plurality of sense amplifiers each sensing data in a selected memory column and in the redundant column; a comparator to compare a sensed output and a cell-data expected value for each sense amplifier; and a verifier to, in regular mode, replace an output of the sense amplifier for one of the memory columns designated based on the information stored in the memory with the an output of the sense amplifier for the redundant column and compare the output of the sense amplifier for the redundant column with a reference level whereas, in test mode, compare outputs of the sense amplifiers for the memory columns and also the output of the sense amplifier for the redundant column with the reference level irrespective of the information stored in the memory.

DETAILED DESCRIPTION OF EMBODIMENTS

Embodiments of semiconductor device according to the present invention will be disclosed with reference to the attached drawings.

(First Embodiment)

A semiconductor device according to the first embodiment of the present invention will be disclosed with reference to FIGS. 1 to 4.

Figure 13:
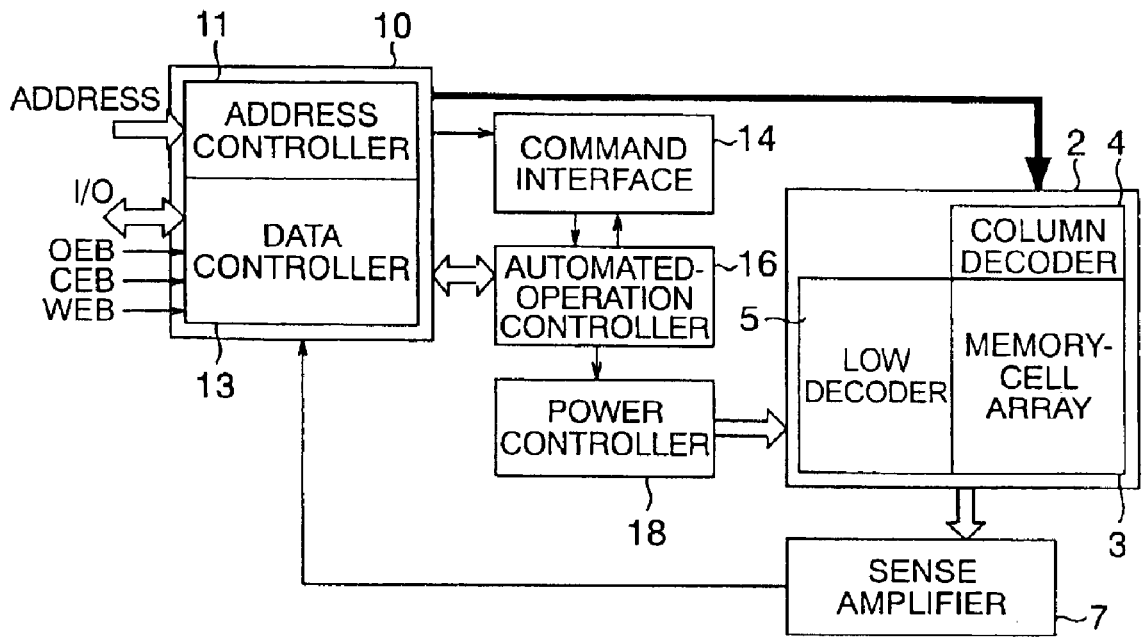
FIG. 13 shows a block diagram of a general flash memory.

The semiconductor device in the first embodiment has several circuit components corresponding to those shown in FIG. 13 such as the flash memory including the memory-cell array 3, the memory section 2 having the column decoder 4 and the row decoder 5, the sense amplifier 7, the controller 10 having the address controller 11 and the data controller 13, the command interface 14, the automated-operation controller 16 and the power controller 18.

The memory section 2 is controlled by the address controller 11 based on entered addresses. It is further controlled by the data controller 13 in response to a chip-enable signal CEB and a write-enable signal WEB.

Data entered via I/O are sent to the memory section 2 through the data controller 13; conversely, data retrieved by the sense amplifier 2 are output to I/O through the data controller 13. Commands entered via I/O are sent to the automated-operation controller 16 and/or the power controller 18 through the command interface 14.

The power controller 18 controls power supplied to the memory section 2. The automated-operation controller 16 has a function of automatically erasing data in several blocks, for example.

Figure 1:
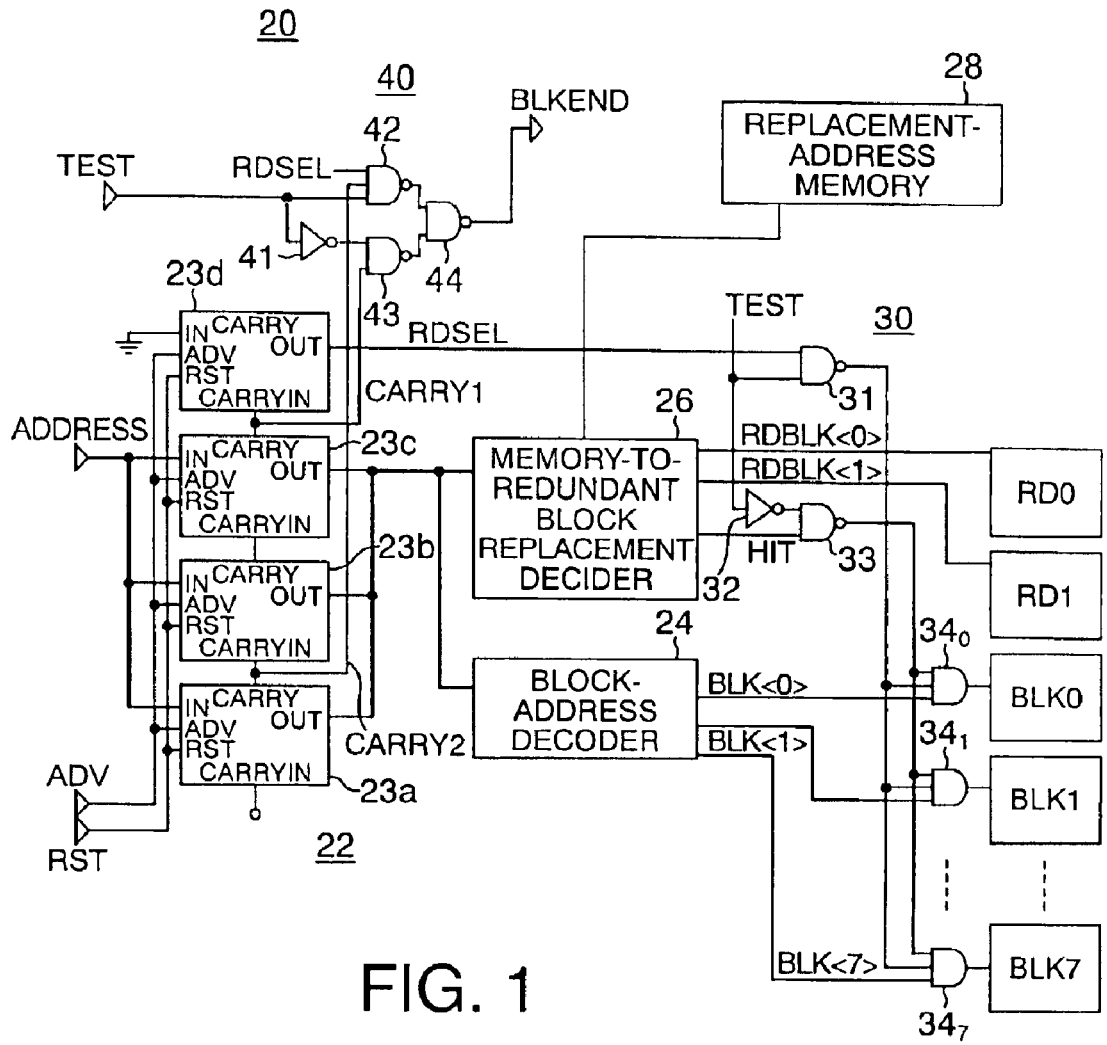
FIG. 1 shows a block diagram of an address controller used in a semiconductor device according to the first embodiment of the present invention.

FIG. 1 shows an address controller used in first embodiment, which corresponds to the address controller in FIG. 13.

An address controller 20 in this embodiment is used for a memory section having eight memory blocks BLK0 to BLK7 and two redundant blocks RD0 and RD1. It is equipped with an address counter 22, a block-address decoder 24, a memory-to-redundant block replacement decider 26, a replacement-address memory 28, a block-selection controller 30 and a last-block decider 40.

The address counter 22 includes address buffers 23a, 23b and 23c, and a dummy buffer 23d. Each of the address buffers and the dummy buffer is made up of an address buffer 23 shown in FIG. 15, having a counter 230 and a multiplexer 250. The multiplexer 250 is made up of NAND gates 251, 253 and 254, and an inverter 252.

In regular retrieval (READ="HIGH"), an address entered via an input terminal IN is output via an output terminal OUT. In automatic erasure (READ="LOW") with address counting, instead, the output of the counter 230 (the output of an inverter 238, described later) is output via the output terminal OUT.

The counter 230 is equipped with N-channel MOS transistors 231 and 237, the gate of each receiving a reset signal RST, a latch 232 having an inverters 232a and 232b, a transfer gate 234, a latch 235 having an inverters 235a and 235b, an inverter 238, a transfer gate 239, a NAND gate 240, an inverter 241, a NAND gate 242 and an inverter 243.

The input to the latch 232 is reset by the transistor 231. The input to the latch 235 is stored in the transistor 237. The output of the latch 232 is connected to the input of the latch 235 via the transfer gate 234. The output of the latch 235 is connected to the input of the inverter 238. The output the inverter 238 is sent to the multiplexer 250 and also fed back to the input of the latch 232 via the transfer gate 239. The input of the latch 232 is connected to one of two inputs of a 2-inut NAND gate 240. A carry-in signal CARRYIN is supplied to the other input of the 2-inut NAND gate 240. The output of the NAND gate 240 is output as a carry signal CARRY via the inverter 241. The carry-in signal CARRYIN is also supplied to one of two inputs of a 2-inut NAND gate 242, the other input receiving a count-up pulse signal ADV.

The counter 230 functions as disclosed below.

a) The output of the inverter 238 and the carry signal CARRY vary from a low to a high level on transition of the count-up pulse signal ADV from a low to a high level, supplied against a low-level output of the inverter 238 whereas a high-level carry-in signal CARRYIN.

b) The output of the inverter 238 and the carry signal CARRY vary from the high to low level on transition of the count-up pulse signal ADV from the low to high level, supplied against a high-level output of the inverter 238 and the high-level carry-in signal CARRYIN.

c) The output of the inverter 238 and the carry signal CARRY inevitably stay at the low level against a low-level carry-in signal CARRYIN.

In the address counter 22 shown in FIG. 1, made up of the address buffers 23a, 23b and 23c, and the dummy buffer 23c, as described above, the high-level carry-in signal CARRYIN is always supplied to the lowest-stage address buffer 23a. The address buffer 23a then outputs a carry signal CARRY which is supplied to the next-stage address buffer 23b, as a carry-in signal CARRYIN. The address buffer 23b outputs a carry signal CARRY which is supplied to the next-stage address buffer 23c, as a carry-in signal CARRYIN. The address buffer 23c outputs a carry signal CARRY which is then supplied, as a carry-in signal CARRYIN, to the next-stage dummy buffer 23d, the input IN thereof being grounded.

In a regular retrieval operation, a 3-bit block-address signal is supplied to the address counter 22 from an address pad (not shown) in such a way that the least, the middle and the most significant bits of the block-address signal are input to the address buffers 23a, 23b and 23c, respectively.

In an automatic erasing operation, the address counter 22 counts the total number of pulses of the input count-up signal ADV and outputs a block address corresponding to the total pulse number. In detail, for example, a one count-up pulse signal ADV causes the address buffer 23a to generate a high-level output signal whereas both address buffers 23b and 23c to generate a low-level output signal. Another count-up pulse signal ADV causes the address buffer 23a to generate a low-level output whereas the address buffer 23b a high-level output but the address buffer 23c the low-level output. Still another count-up pulse signal ADV causes the address buffer 23a to generate again the high-level output, the address buffer 23b the high-level output but the address buffer 23c the low-level output.

A signal RDSEL generated at the output OUT of the dummy buffer 23d is used to inhibit selection of memory blocks BLK0 to BLK7. A carry signal CARRY1 output from the address buffer 23c is used to determine whether a redundant block is the last redundant block.

Figure 14:
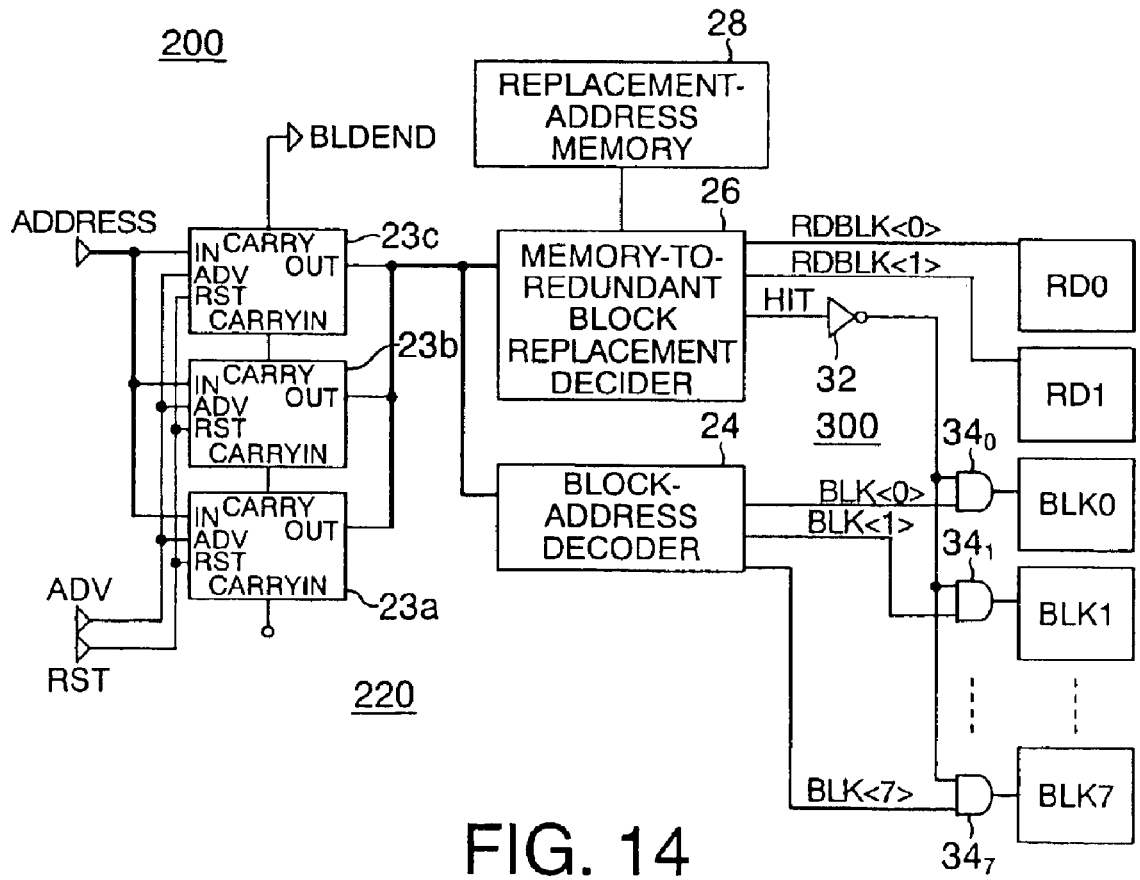
FIG. 14 shows a block diagram of address-controller circuitry in a known semiconductor device.

In contrast, shown in FIG. 14 is an address controller 200 in a known semiconductor device, used for a memory section having eight memory blocks BLK0 to BLK7 and two redundant blocks RD0 and RD1. It is equipped with an address counter 220, a block-address decoder 24, a memory-to-redundant block replacement decider 26, a replacement-address memory 28 and a block-selection controller 300.

A carry signal CARRY1 output from an address buffer 23c in the known address controller 200 is used to determine whether a block corresponds to the last address in an address space. Addresses of memory blocks and data on redundant blocks, with which the memory blocks will be replaced when defective, have been stored in the replacement-address memory 28.

The block-selection controller 300 has an inverter 32 and AND gates $34_0$ to $34_7$ corresponding to the memory blocks BLK0 to BLK7. Each AND gate $34_i$ (i=0, . . . , 7) selects the corresponding memory block $BLK_i$ in response to a redundant-block use instruction signal HIT from the memory-to-redundant block replacement decider 26 via the inverter 32 and also a block-selection signal BLK <i>.

Figure 16:
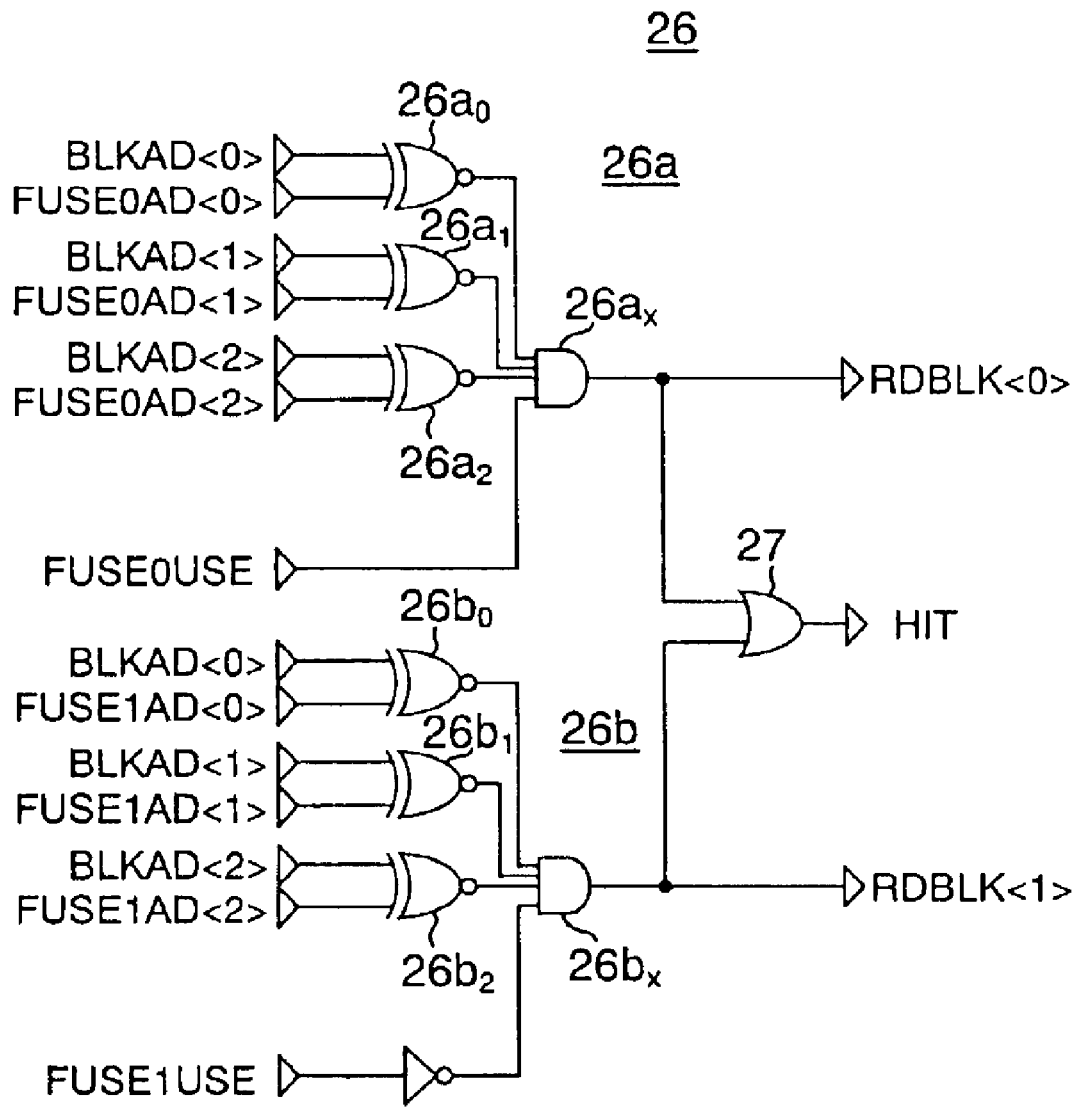
FIG. 16 shows a circuit diagram of redundant-block replacement-decision circuitry.

A detailed circuitry for the memory-to-redundant block replacement decider 26 in this embodiment is shown in FIG. 16.

The memory-to-redundant block replacement decider 26 in FIG. 16 has redundant-block selectors 26a and 26b, and an OR gate 27.

The redundant-block selector 26a has three exclusive-NOR circuits $26a_0$, $26a_1$ and $26a_2$ and a 4-input AND gate 26ax. It generates a redundant-block selection signal RDBLK <0> for selecting the redundant block RD0 based on block-address signals BLKAD<0> to BLKAD<2>, a signal FUSE0USE indicating whether to use the redundant block RD0 and address signals FUSE0AD<0> to FUSE0AD<2> for a memory block to be replaced with the redundant block RD0, all signals being sent from the address counter 22.

The redundant-block selector 26b has three exclusive-NOR circuits $26b_0$, $26b_1$ and $26b_2$ and a 4-input AND gate 26bx. It generates a redundant-block selection signal RDBLK <1> for selecting the redundant block RD1 based on block-address signals BLKAD<0> to BLKAD<2>, a signal FUSE1USE indicating whether to use the redundant block RD1 and address signals FUSE1AD<0> to FUSE1AD<2> for a memory block to be replaced with the redundant block RD1, all signals being sent from the address counter 22.

The OR gate 27 generates the redundant-block use instruction signal HIT based on the outputs of the AND gates 26ax and 26bx.

Addresses of memory blocks and data on redundant blocks, with which the memory blocks will be replaced when defective, have been stored in the replacement-address memory 28. For example, the memory block BLK0 at an address 0h (0 in hexadecimal) will be replaced with the redundant block RD0, and the memory block BLK1 at an address 1h (1 in hexadecimal) will be replaced with the redundant block RD1 when defective.

The addresses for memory blocks to be replaced in if defective can be directly written in a nonvolatile rewritable replacement-address memory.

Figure 2:
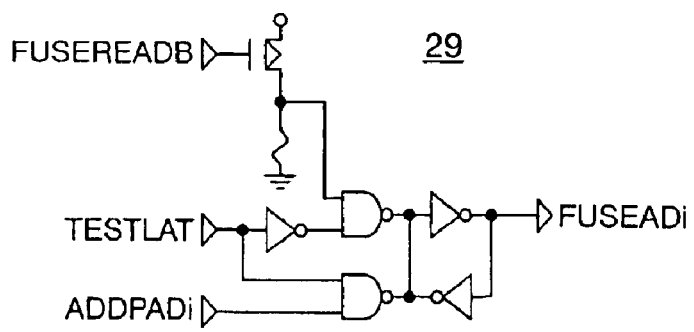
FIG. 2 shows a circuit diagram of a test replacement-address memory for temporarily storing data on addresses for replacements.

On the contrary, a fuse-type replacement-address memory, for which writing is allowed only once, requires a test replacement-address memory 29 such as shown in FIG. 2 for temporarily storing replacement-address data in test mode.

The test replacement-address memory 29 shown in FIG. 2 stores replacement-address data within a replacement-address retrieval period (FUSEREADB="LOW") usually at power on. In test mode, a high-level signal TESTLAT allows a memory-block address to be replaced entered via input pad (not shown) to be temporarily stored in the test replacement-address memory 29 without directly written in the fuse-type replacement-address memory.

The block-selection controller 30 has a NAND gate 31, an inverter 32, a NAND gate 33 and AND gates $34_0$ to $34_7$ corresponding to the memory blocks BLK0 to BLK7. Each AND gate $34_i$ (i=0, . . . , 7) selects the corresponding memory block $BLK_i$ in response to a test signal TEST sent via the inverter 32 and the NAND gate 33, a redundant-block use instruction signal HIT from the memory-to-redundant block replacement decider 26 via the NAND gate 33 and also a block-selection signal BLK <i>.

The last-block decider 40 has an inverter 41 and NAND gates 42, 43 and 44. The NAND gate 42 performs a NAND operation based on the output signal RDSEL from the dummy buffer 23d, the test signal TEST and the carry signal CARRY2 from the address buffer 23a, the result of NAND operation being supplied to the NAND gate 44. The NAND gate 43 performs a NAND operation based on the test signal TEST supplied via the inverter 41 and the carry signal CARRY1 from the address buffer 23c, the result of NAND operation being also supplied to the NAND gate 44. The NAND gate 44 performs a NAND operation based on the outputs of the NAND gates 42 and 43 to generate a signal BLKEND to be used for determining whether a redundant block is the last redundant block.

Disclosed next is an operation of the address controller 20 shown in FIG. 1.

Figure 15:
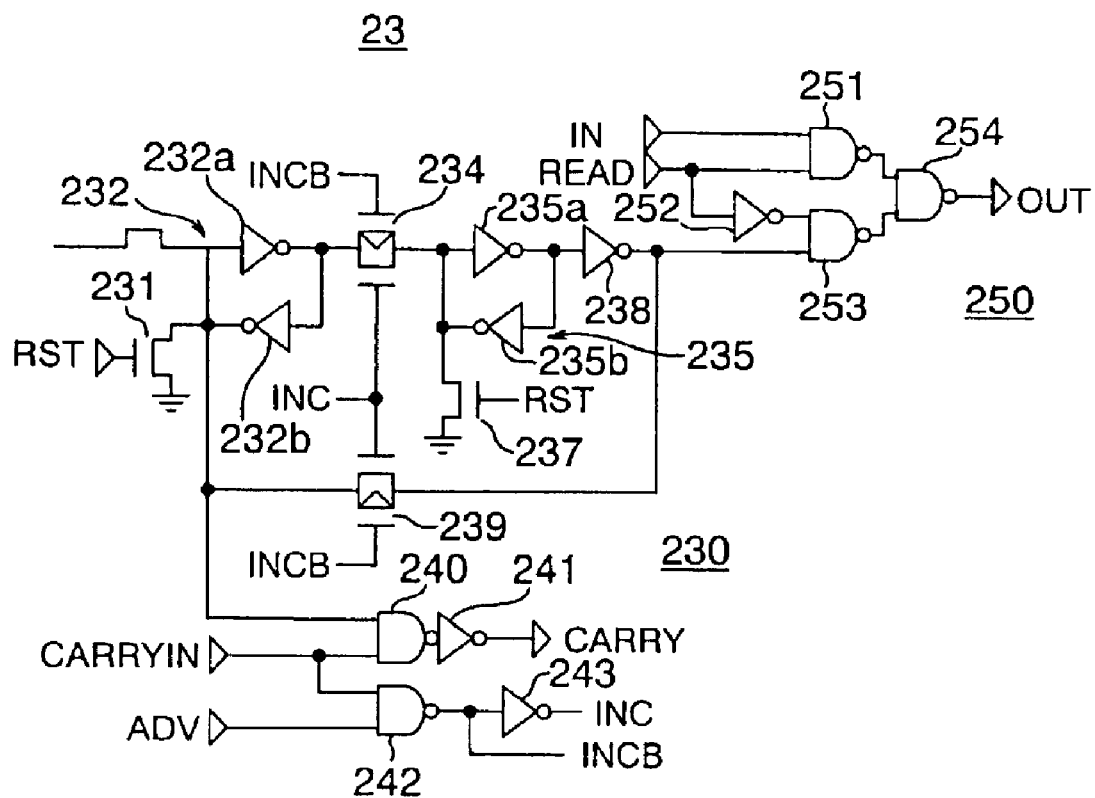
FIG. 15 shows a circuit diagram of address buffer used in an address counter.

The operation described first for the address controller 20 is performed in regular retrieval (at the high level for the signal READ shown in FIG. 15). The test signal TEST usually at a low level in regular retrieval causes the NAND gate 31 in the block-selection controller 30 to generate a high-level output. A block address entered via an address pad (not shown) is sent to the block-address decoder 24 and the memory-to-redundant block replacement decider 26 via the address counter 22, in regular retrieval.

A block address sent via the address counter 22, which is not any address of defective memory blocks, causes the memory-to-redundant block replacement decider 26 to generate a low-level redundant-block use instruction signal HIT, and further causes one block-selection signal, for selecting the memory block corresponding to that block address, only to be set at a high level among block-selection signals output from the block-address decoder 24, the other selection signals being set at a low level. For example, a block-selection signal BLK <0> is set at a high level whereas other block-selection signals BLK <1> to BLK <7> are set at a low level when the memory block BLK0 corresponds to that block address. The block-selection controller 30 selects only a memory block corresponding to that block address accordingly.

Contrary to this, a block address sent via the address counter 22, which is an address of a defective memory block, causes the memory-to-redundant block replacement decider 26 to generate a high-level redundant-block use instruction signal HIT. The test signal TEST usually at a low level in regular retrieval causes the NAND gate 33 to generate a low-level output. The block selector 30 thus inhibits selection of the memory block BLK0 to BLK7. Either a redundant-block selection signal RDBLK <0> or RDBLK <1> output from the memory-to-redundant block replacement decider 26 based on data stored in the replacement-address memory 28 is set at a high level whereas the other at a low level, thus selecting a redundant block to be used instead of the defective memory block. For example, the redundant-block selection signal RDBLK <0> is set at the high level whereas RDBLK <1> at the low level in selecting the redundant block RD0 for the defective memory block.

The operation described next for the address controller 20 is performed in automatic erasure (at a low level for the signal READ shown in FIG. 15).

The address counter 22 generates a block address increased by one from the block address generated just before for each count-up pulse signal ADV supplied thereto. This is because, in an automatic-erasing operation, the address counter 22 generates a block address corresponding to the total pulses of the count-up signal ADV supplied thereto.

Like the regular retrieval operation, a memory block is selected if not defective and corresponding to a block address output from the address counter 22.

If this memory block is defective, however, the memory-to-redundant block replacement decider 26 generates a high-level redundant-block use instruction signal HIT, the following operation depending on the logic state of the test signal TEST.

A low-level test signal TEST causes the NAND gate 33 to generate a low-level output, like the regular retrieval operation, thus a redundant block corresponding to the above block address is selected for memory-block replacements, followed by automatic-erasing operation to the redundant block.

In contrast, a high-level test signal TEST causes the NAND gate 33 to generate a high-level output, thus the memory blocks BLK0 to BLK7 being selected one by one in accordance with the output of the block address decoder 24, followed by automatic-erasing operation. The address buffer 23c generates a high-level signal CARRY1 when the address counter 22 generates the block address of the last memory block BLK7. The last-block selection flag BLEND will, however, not be set at a high level due to a low level for the output RDSEL of the dummy buffer 23d. Thus, block-address count-up continues to cause the dummy buffer 23d to generate a high-level output RDSEL which inhibits selection of any memory blocks BLK0 to BLK7.

The redundant blocks RD0 and RD1 are selected one by one for writing and erasure if their block addresses are 0h (0 in hexadecimal) and 1h (1 in hexadecimal), respectively. The last-block selection flag BLKEND is set at a high level when the last redundant block is selected (at a high-level RDSEL) and hence the automatic-erasing operation will halt when writing and erasure to the last redundant block are completed.

The automatic-erasing operation described above is controlled by the automated-operation controller 16 shown in FIG. 13, which is explained with reference to FIGS. 17A, 17B and 17C.

Figure 17A:
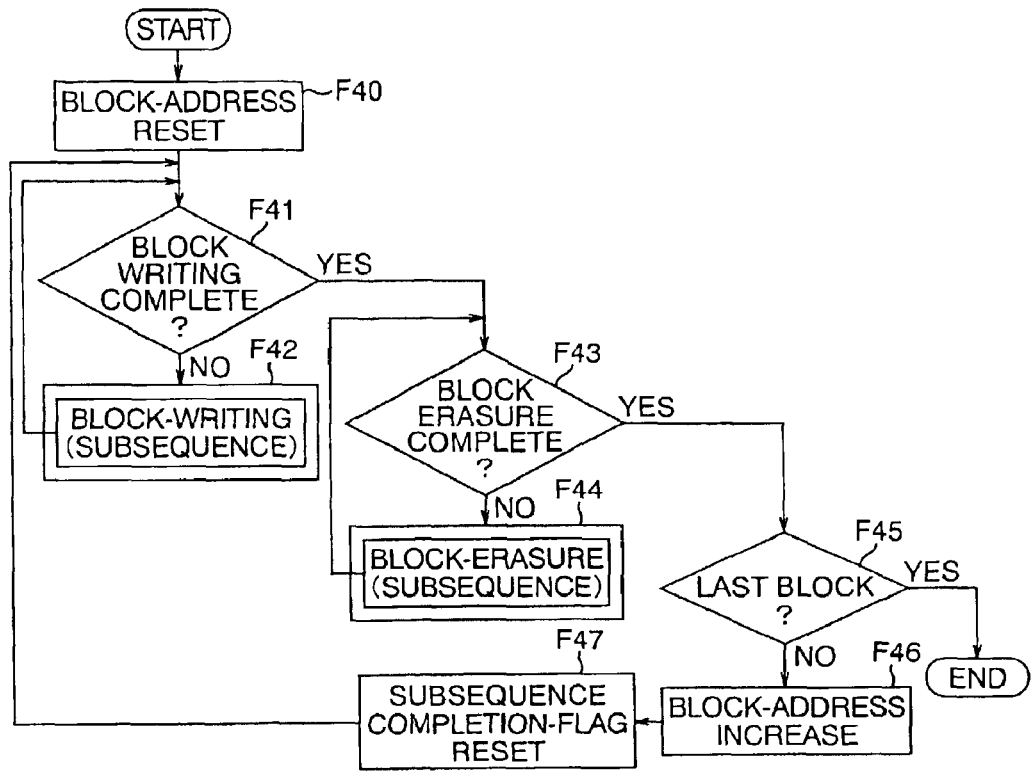
FIGS. 17A, 17B and 17C show flowcharts indicating an automatic-erasure operation.

The block address in the address counter 22 is reset in step F40, as shown in FIG. 17A. It is determined in step F41 whether a block-writing procedure is complete for all cells in a memory block or a redundant block corresponding to the current block address.

Figures 17B, 17C:
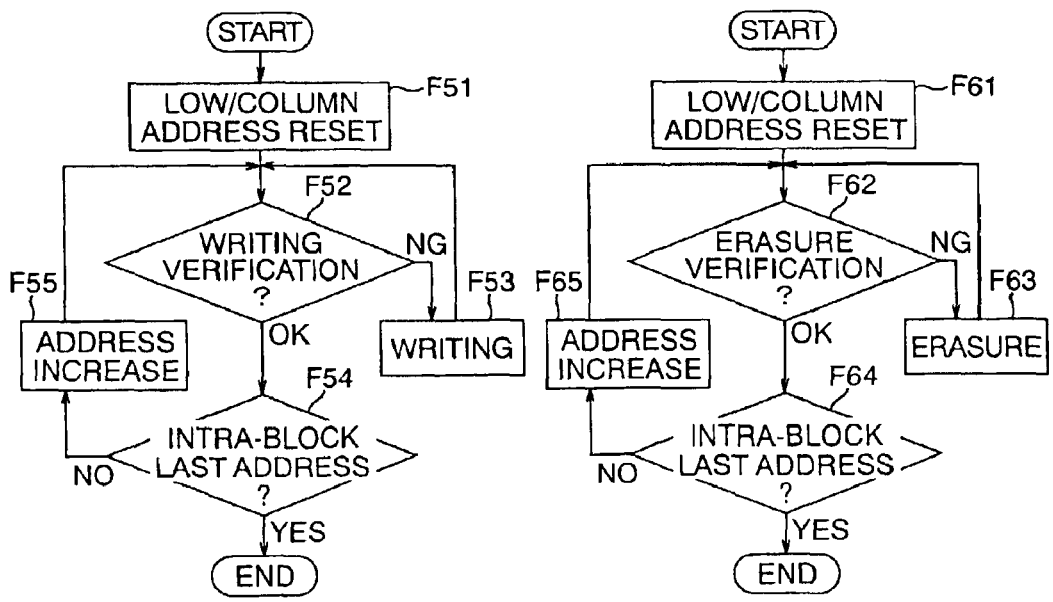

If not complete, the block-writing procedure shown in FIG. 17B proceeds in step F42. A row or column address is reset in step F51. The writing verification is performed in step F52 to verify whether the block-writing procedure is complete for all cells corresponding to the current row or column address. If not, the block-writing procedure is performed in step F53, and the sequence returns to step F52. On the contrary, if complete, it is determined in step F54 whether the row or column address is the last address. The block-writing procedure ends if it is the last address. If not, however, the row or column address is increased in step F55, followed by step F52 to repeat the sequence for the block-writing procedure.

On completion of the block-writing procedure to the memory block corresponding to the current block address in step F42 shown in FIG. 17A, the sequence returns to step F41 to determine whether the block-writing procedure is complete. If complete, it is further determined in step F43 whether an erasing procedure to the memory block corresponding to the current block address is complete. If not complete, the erasing procedure is performed in step F44.

The erasing procedure is disclosed in detail with reference to FIG. 17C.

A row or column address is reset in step F61. The erasure verification is performed in step F62 to verify whether the block-erasing procedure is complete for all cells corresponding to the current row or column address. If not, the block-erasing procedure is performed in step F63, and the sequence returns to step F62. On the contrary, if complete, it is determined in step F64 whether the row or column address is the last address. The block-erasing procedure ends if it is the last address. If not, however, the row or column address is increased in step F65, followed by step F62 to repeat the sequence for the block-erasing procedure.

On completion of the block-erasing procedure in step F44 shown in FIG. 17A, the sequence returns to step F43 to determine whether the block-erasing procedure is complete to the memory block corresponding to the current block address. If complete, it is further determined in step F45 whether the block address is the last address. The automatic-erasing procedure ends if it is the last address. If not, the block address is increased by one in step F46, followed by step F47 to reset completion flags used for the block-writing procedure in step F42 and the block-erasing procedure in step F44. The sequence returns to step F41 again to repeat the steps disclosed above for the automatic-erasing operation.

As disclosed above, writing and erasure are achieved by one sequence for all memory and redundant blocks.

Figure 3:
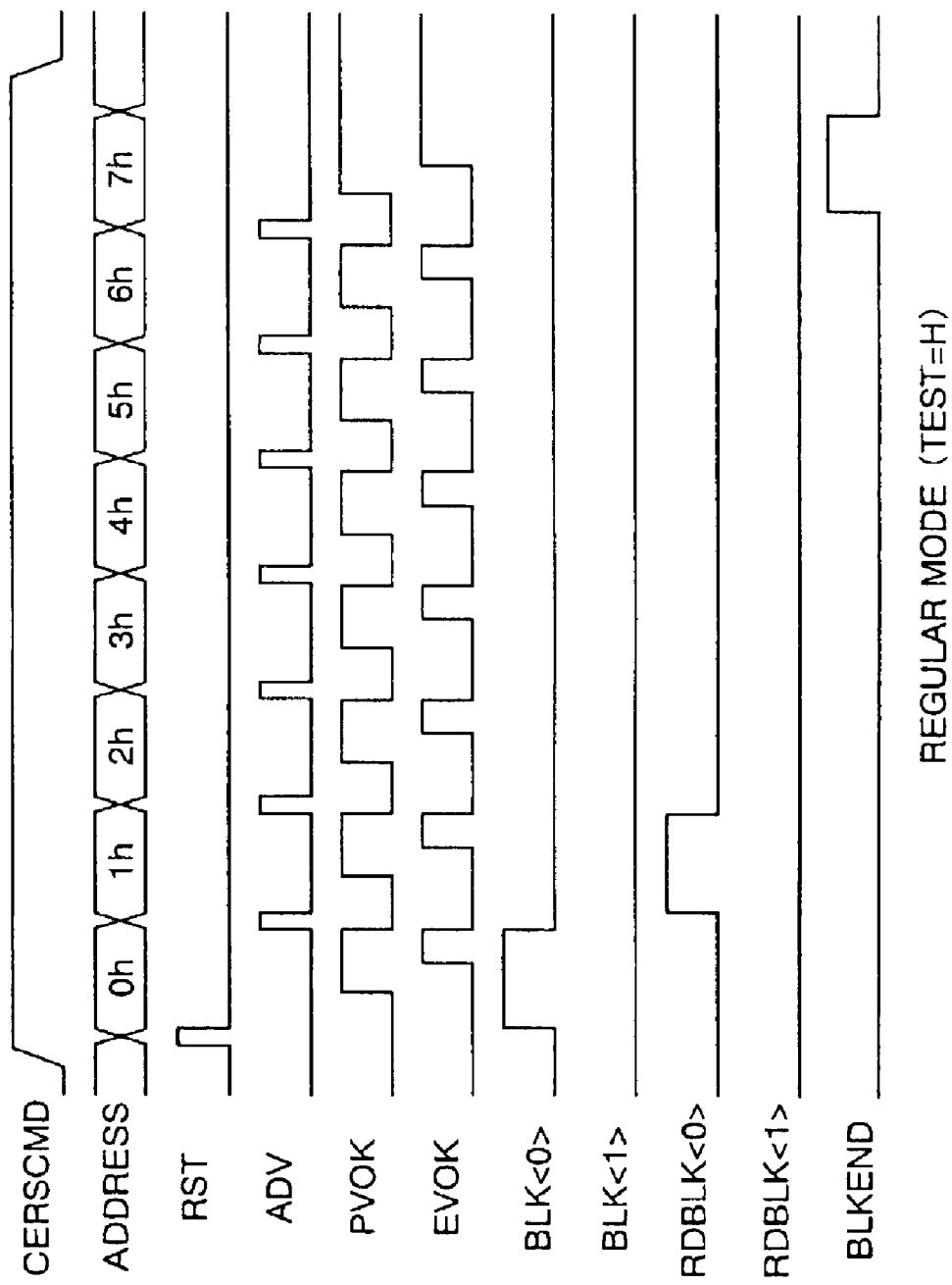
FIG. 3 shows a timing chart indicating block-selection timing in regular-operation mode for the address controller in the first embodiment.
Figure 4:
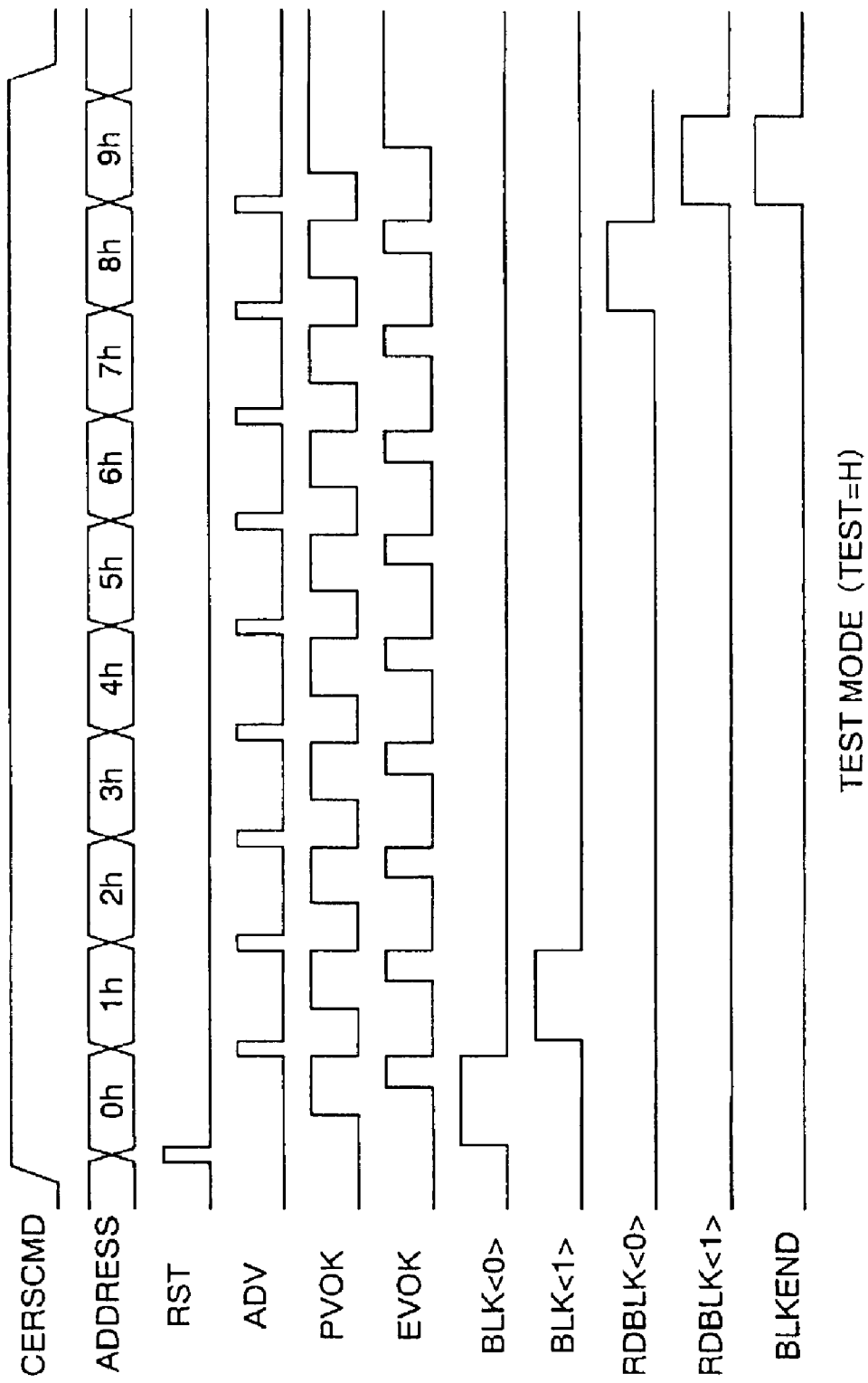
FIG. 4 shows a timing chart indicating block-selection timing in test mode for the address controller in the first embodiment.

Timing charts for block selection in regular-operation and test modes are shown in FIGS. 3 and 4, respectively.

FIG. 3 indicates block selection in regular-operation mode when the memory block BLK <1> is defective, for example, and when selected at an address 1h, it is replaced with the redundant block RD0 according to the replacement-address data. FIG. 4 indicates block selection in test mode in which defective memory blocks at addresses 0h and 1h are replaced with the redundant blocks RD0 and RD1 according to the replacement-address data.

As disclosed above, writing and erasure are achieved by one sequence for all memory and redundant blocks, thus this embodiment offers a short test time.

Figure 23:
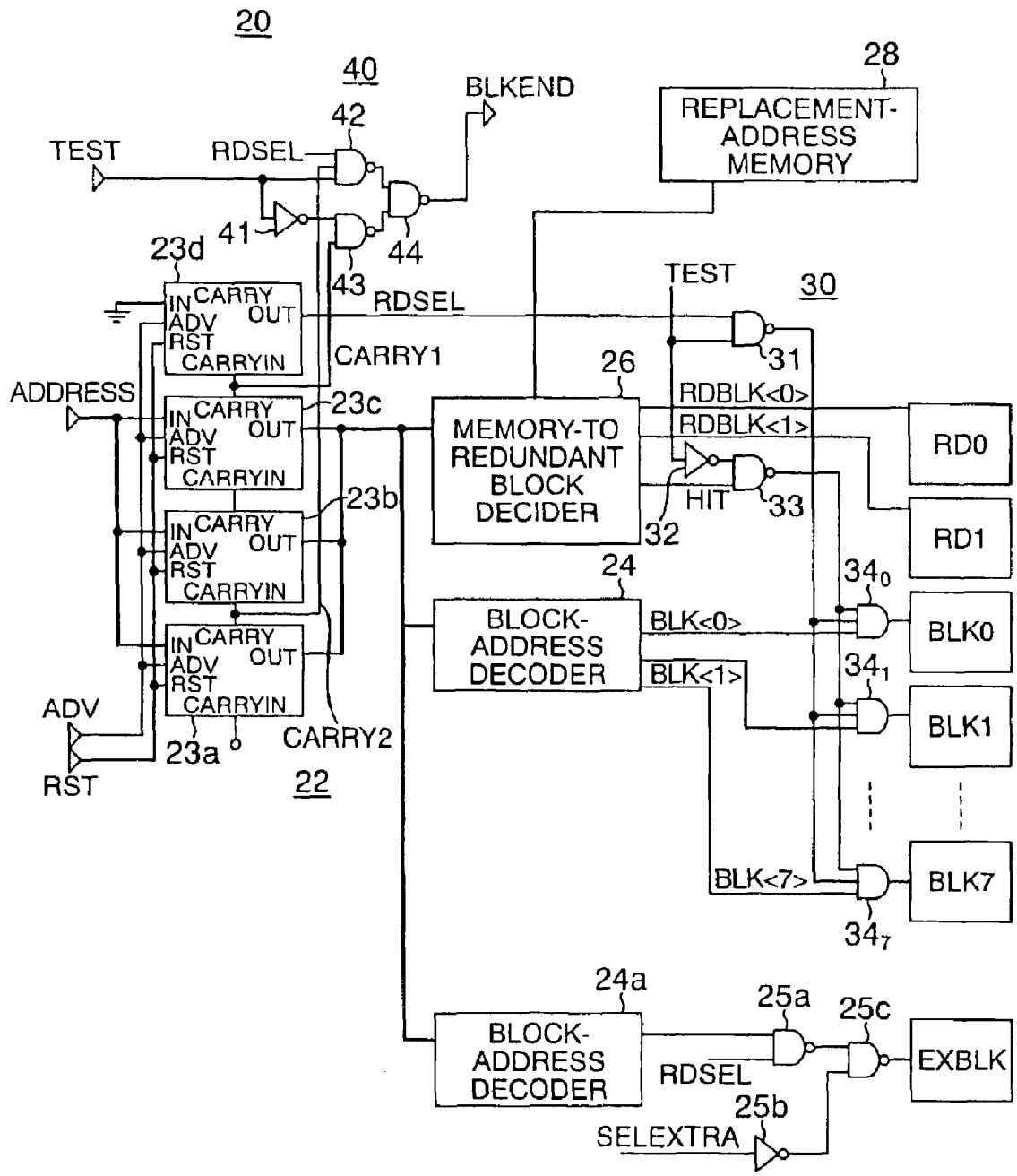
FIG. 23 shows a block diagram of address-controller circuitry in a modification to the first embodiment.

Disclosed next with reference to FIG. 23 is a modification to the first embodiment.

Flash memories can have a memory area, a memory-cell array, in addition to the addressable memory space. The memory-cell array is made up of redundant blocks different from those for use in defective-block replacements. These redundant blocks are accessible by a specific command and used as a hidden memory area for storing confidential information or a memory area for storing the history (data) of chip manufacture/testing.

This modification is applicable to writing/erasing procedures to these extra redundant blocks like those for use in defective-block replacements.

Shown in FIG. 23 is an address controller for use in block selection for blocks with one extra memory block EXBLK.

An address controller 20, shown in FIG. 23, has a block-address decoder 24a, a NAND gate 25a, an inverter 25b and a NAND gate 25c in addition to the circuit components of the counterpart shown in FIG. 1 in the first embodiment.

Block addresses can be assigned to redundant blocks RD0 and RD1 and also the extra memory block EXBLK in an address space expanded two times with an extra signal RDSEL. The memory block EXBLK can be selected at the block address that is specified by a high-level signal RDSEL ORed with a command-selected signal SELEXTRA. Such an extra memory space can further be created in extra rows or columns.

(Second Embodiment)

Figure 5A:
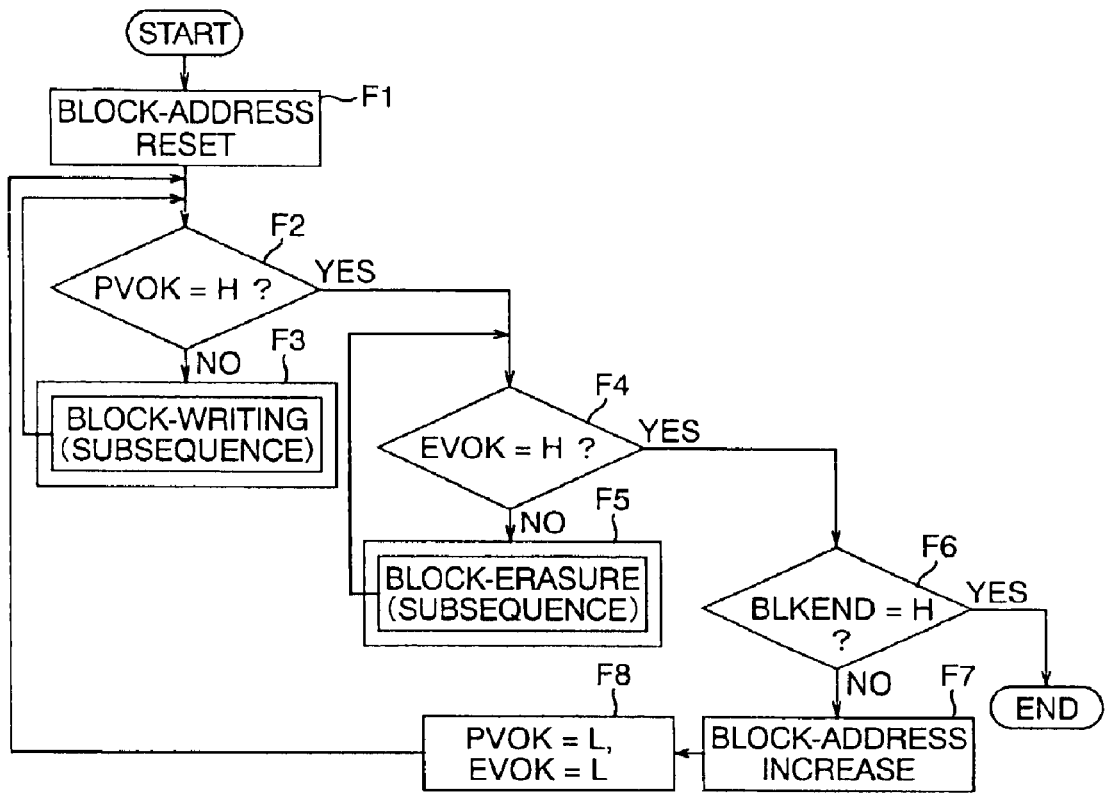
FIGS. 5A, 5B and 5C show flowcharts indicating an automatic-erasure operation in a semiconductor device according to the second embodiment of the present invention.
Figures 5B, 5C:
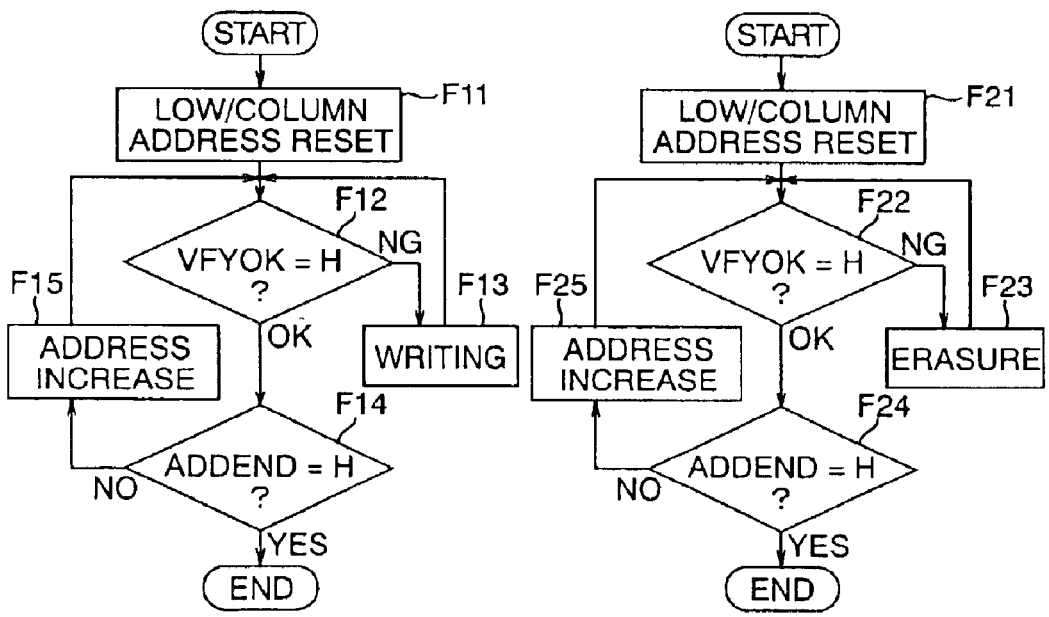
Figure 6:
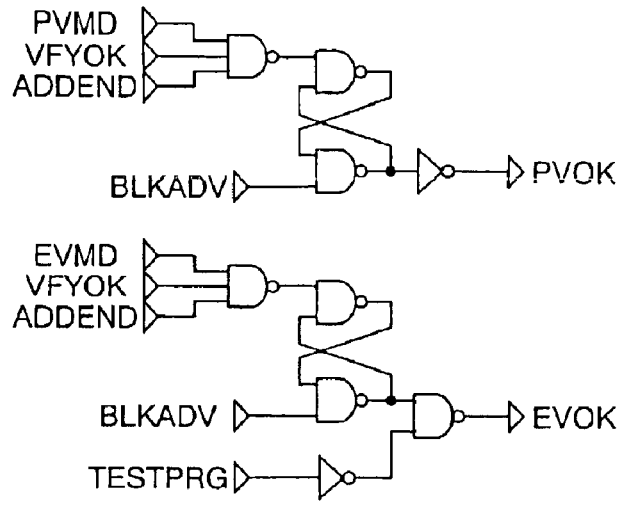
FIG. 6 shows a circuit diagram of flag-setter circuitry used for the automatic-erasure operation shown in FIGS. 5A, 5B and 5C.

A semiconductor device according to the second embodiment of the present invention will be disclosed with reference to FIGS. 5A, 5B and 5C and also FIG. 6.

The first embodiment achieves erasure to all blocks in which the writing procedure is performed to all blocks before erasure in the erasure sequence shown in FIGS. 17A, 17B and 17C.

The writing procedure to all blocks including redundant blocks and cells, including redundant cells, is achieved with single entry of chip-erasure sequence command when the writing subsequence is only executed whereas the erasure subsequence is skipped in FIGS. 17A, 17B and 17C.

The procedures in FIGS. 17A, 17B and 17C require five types of flags: a pass/failure flag (VFYOK) for the writing (or erasure) verification per address, a completion flag (PVOK) for the writing subsequence, a completion flag (EVOK) for the erasure subsequence, an intra-block last-address selection flag (ADDEND) and a last-block selection flag (BLKEND).

FIGS. 17A, 17B and 17C are rewritten with these flags into FIGS. 5A, 5B and 5C, respectively.

The semiconductor device in the second embodiment has a circuit 50 shown in FIG. 6 in addition to the circuit components in the first embodiment. An automatic-erasing operation is performed in accordance with the flowcharts shown in FIGS. 5A, 5B and 5C, which is executed by the circuit 50 shown in FIG. 6.

Disclosed below is the automatic-erasing operation in the second embodiment.

The block address in the address counter 22 is reset in step F1, as shown in FIG. 5A. It is determined based on the flag PVOK in step F2 whether a block-writing procedure is complete for all cells in a memory block or a redundant block corresponding to the current block address.

If not complete, or the flag PVOK is at a low level, the block-writing procedure shown in FIG. 5 is performed in step F3, as shown in FIG. 5. A row or column address is reset in step F11. The writing verification is performed based on the flag VFYOK in step F12 to verify whether the block-writing procedure is complete for all cells corresponding to the current row or column address. If not, or the flag VFYOK is at a low level, the block-writing procedure is performed in step F13, and the sequence returns to step F12. On the contrary, if complete, or the flag VFYOK is at a high level, it is determined based on the flag ADDEND in step F14 whether the row or column address is the last address.

The block-writing procedure ends if it is the last address, or the flag ADDEND is at a high level. If not, or the flag ADDEND is at a low level, however, the row or column address is increased in step F15, followed by step F12 to repeat the sequence for the block-writing procedure.

On completion of the block-writing procedure to the memory block corresponding to the current block address in step F3 shown in FIG. 5A, the sequence returns to step F1 to determine whether the block-writing procedure is complete. If complete (PVOK="HIGH"), it is further determined based on the flag EVOK in step F4 whether an erasing operation to the memory block corresponding to the current block address is complete. If not complete, or the flag EVOK is at a low level, the erasing operation is performed in step F5.

The erasing operation is disclosed in detail with reference to FIG. 5C.

A row or column address is reset in step F21. The erasure verification is performed based on the flag VFYOK in step F22 to verify whether the block-erasing procedure is complete for all cells corresponding to the current row or column address. If not, or the flag VFYOK is at a low level, the block-erasing procedure is performed in step F23, and the sequence returns to step F22. On the contrary, if complete, it is determined based on the flag ADDEND in step F24 whether the row or column address is the last address. The block-erasing procedure ends if it is the last address, or the flag ADDEND is at a high level. If not, or the flag ADDEND is at a low level, however, the row or column address is increased in step F25, followed by step F22 to repeat the sequence for the block-erasing procedure.

On completion of the block-erasing procedure in step F5 shown in FIG. 5A, the sequence returns to step F4 to determine whether the block-erasing procedure is complete to the memory block corresponding to the current block address. If complete, or the flag EVOK is at a high level, it is further determined based on the flag BLKEND in step F6 whether the block address is the last address. The automatic-erasing operation ends if it is the last address, or the flag BLKEND is at a high level. On the other hand, if not the last address, or the flag BLKEND is at a low level, the block address is increased by one in step F7, followed by step F8 to reset the flags PVOK and EVOK to be used for the block-writing procedure in step F3 and the block-erasing procedure in step F5. The sequence returns to step F2 again to repeat the steps disclosed above for the automatic-erasing operation.

The flags PVOK and EVOK are generated by the circuit 50 shown in FIG. 6. Signals PVMD and EVMD are set at a high level during the writing and erasure subsequences, respectively. Whenever a new block is selected, the writing subsequence is initiated to reset the flags PVOK and EVOK with a block-address count-up signal (BLKADV). The transition of these flags are shown in FIGS. 3 and 4.

A high-level flag EVOK at a high level for a test signal TESTPREG allows the writing subsequence to all blocks and addresses whereas inhibits the erasure subsequence in the flowcharts shown in FIGS. 5A, 5B and 5C, and then the automated operations ends.

Contrary to this, a high-level flag PVOK at a high level for the test signal TESTPRG allows the erasure subsequence to all blocks and addresses whereas inhibits the writing subsequence in the flowcharts shown in FIGS. 5A, 5B and 5C, and then the automated operations ends.

This test writing is available for regular pattern-data writing in which data are alternately inverted with addresses or I/O parity, etc.

As disclosed above, writing and erasure are achieved by one sequence for all memory and redundant blocks, thus the second embodiment also offers a short test time like the first embodiment.

(Third Embodiment)

Figure 7:
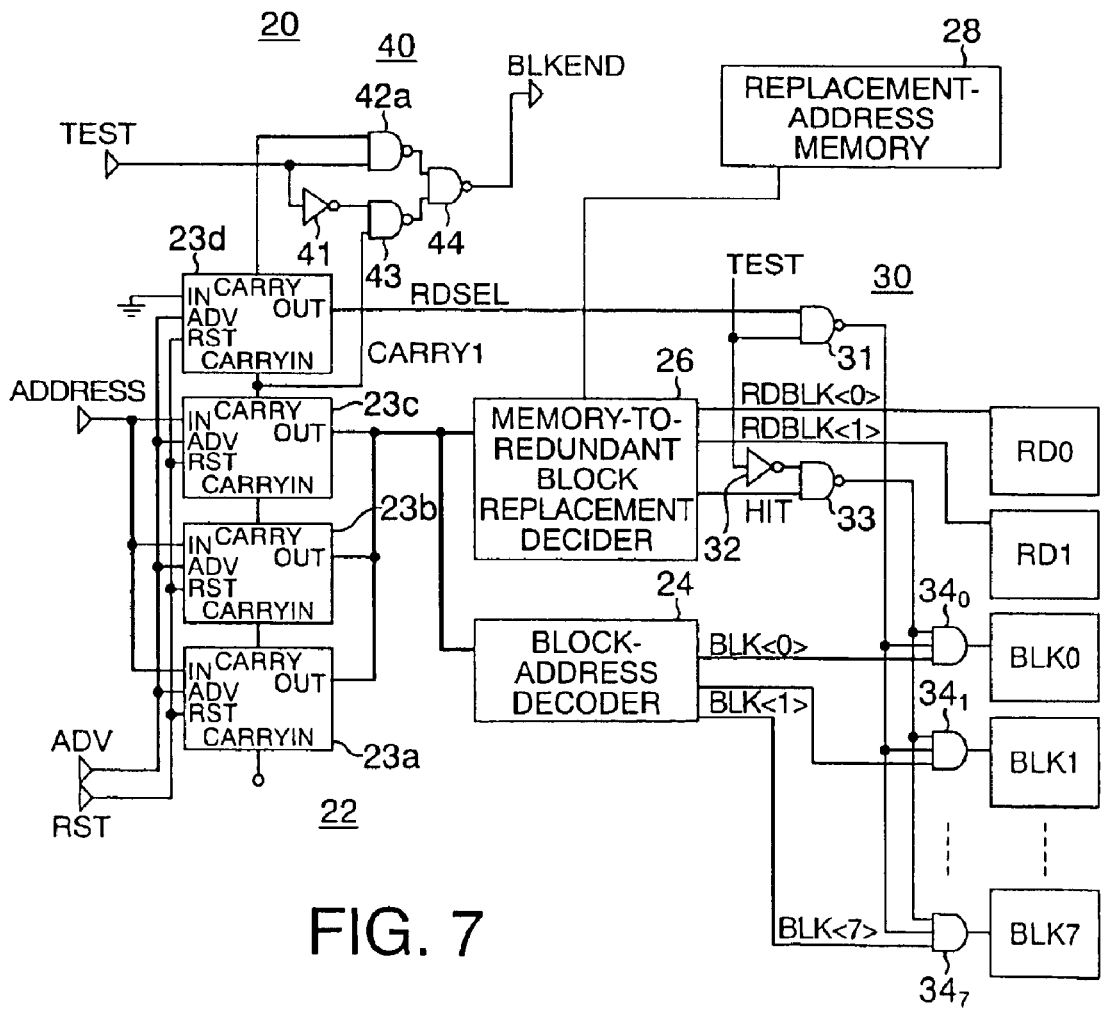
FIG. 7 shows a circuit diagram of address-controller circuitry used in a semiconductor device according to the third embodiment of the present invention.

Disclosed next with reference to FIG. 7 is a semiconductor device according to the third embodiment of the present invention.

Shown in FIG. 7 is a block diagram of an address controller 20 in the semiconductor device of the third embodiment.

The address controller 20 in the first embodiment shown in FIG. 1 completes its sequence at a high level for the signal BLKEND after the completion of block selection to all memory blocks and then all redundant blocks.

Such a high-level signal BLKEND can also be gained after the completion of counting up all block addresses in an address space expanded two times with a dummy buffer 23d, as shown in FIG. 7.

The address controller 20 in the third embodiment has a last-block decider 40A, as shown in FIG. 7, which corresponds to the counterpart 40 in the first embodiment shown in FIG. 1. The last-block decider 40A has a NAND gate 42A corresponding to the NAND gate 42 in the counter part 40. The NAND gate 42A performs a NAND operation based a test signal TEST and a carry signal CARRY from the dummy buffer 23d, the result of NAND operation being supplied to a NAND gate 44.

Redundant blocks are usually fewer than memory blocks in semiconductor devices of the type described so far. It is also true in this embodiment and hence redundant blocks may be in short for selection when many memory blocks become defective. In other words, any more redundant blocks can not be selected, or the signal RDBLK will not be set at a high level.

Figure 8:
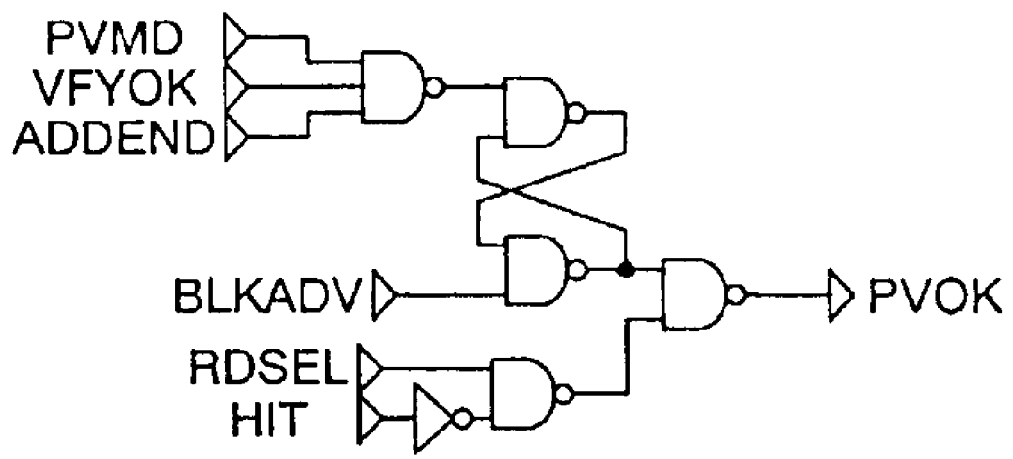
FIG. 8 shows a circuit diagram of flag-setter circuitry used for an automatic-erasure operation in the third embodiment.
Figure 8:
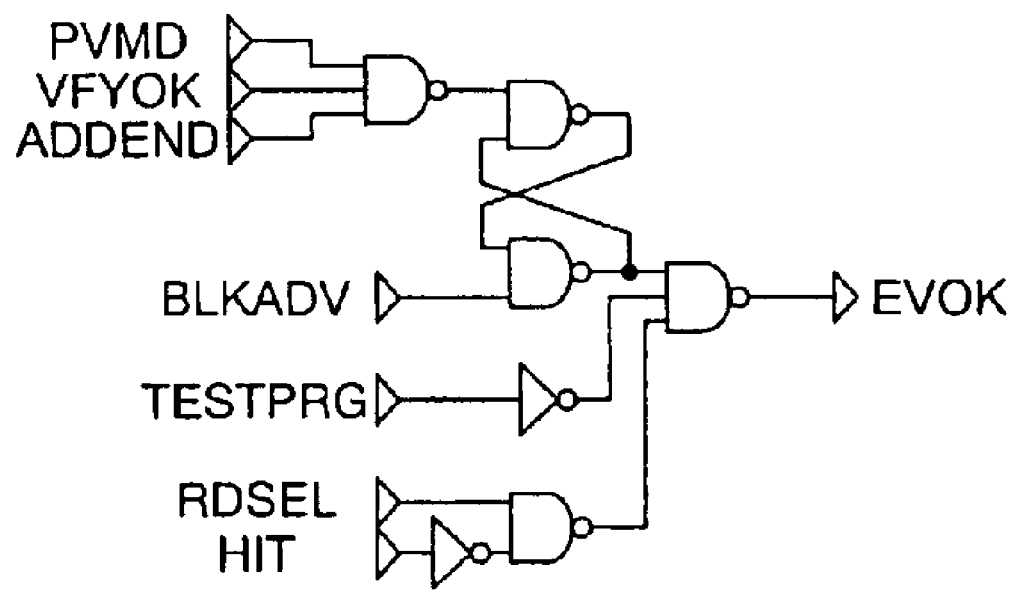

In order to solve such a problem, flags PVOK and EVOK for use in control over sequence branching are set at a high level by a subsequence-flag setter 50A shown in FIG. 8 for proceeding with the necessary sequence in this embodiment.

Figure 9:
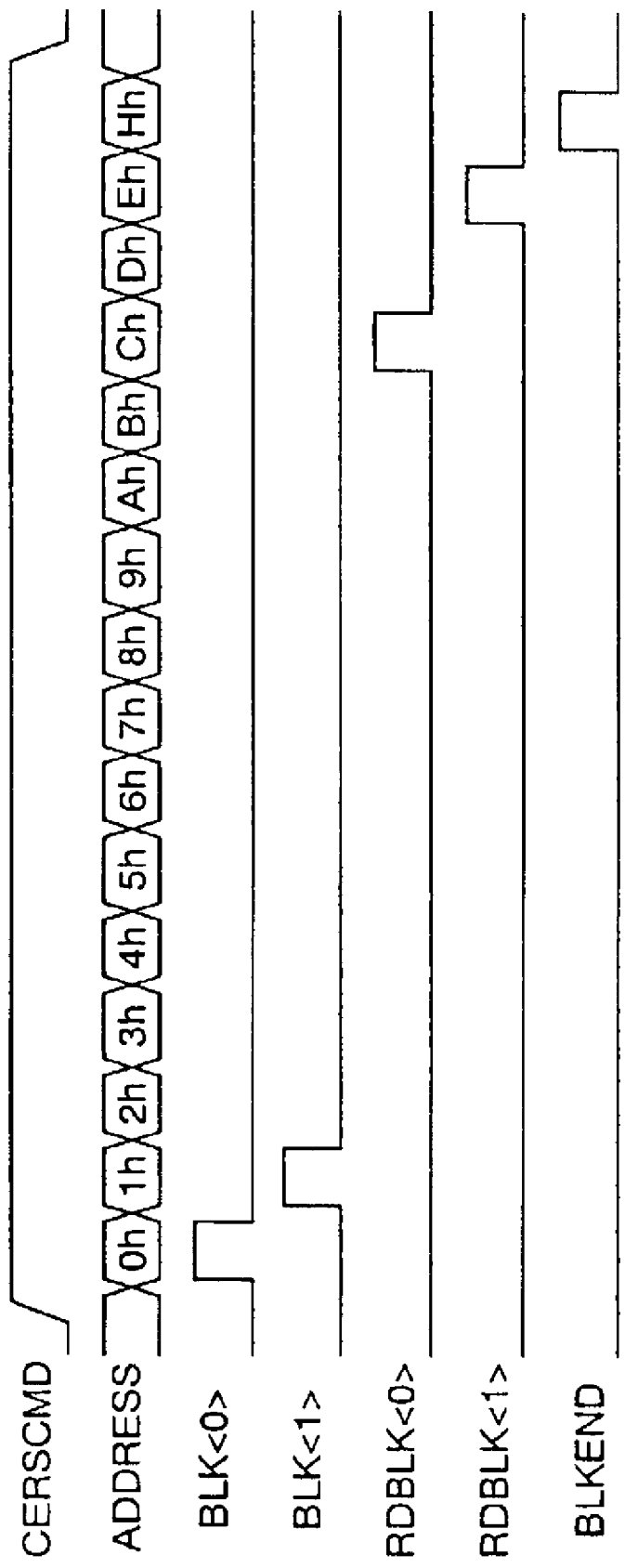
FIG. 9 shows a timing chart indicating block-selection timing in third embodiment.

This arrangement allows any type of block-address data for replacements stored in a replacement-address memory 28, in addition to a serial type. Shown in FIG. 9 is a timing chart for storing BLK <4> and BLK <6> in the replacement-address memory 28 as block-address data for replacements in this arrangement.

Like the first embodiment, the third embodiment achieves writing and erasure with one sequence for all memory and redundant blocks, thus offering a short test time.

(Fourth Embodiment)

Figure 10:
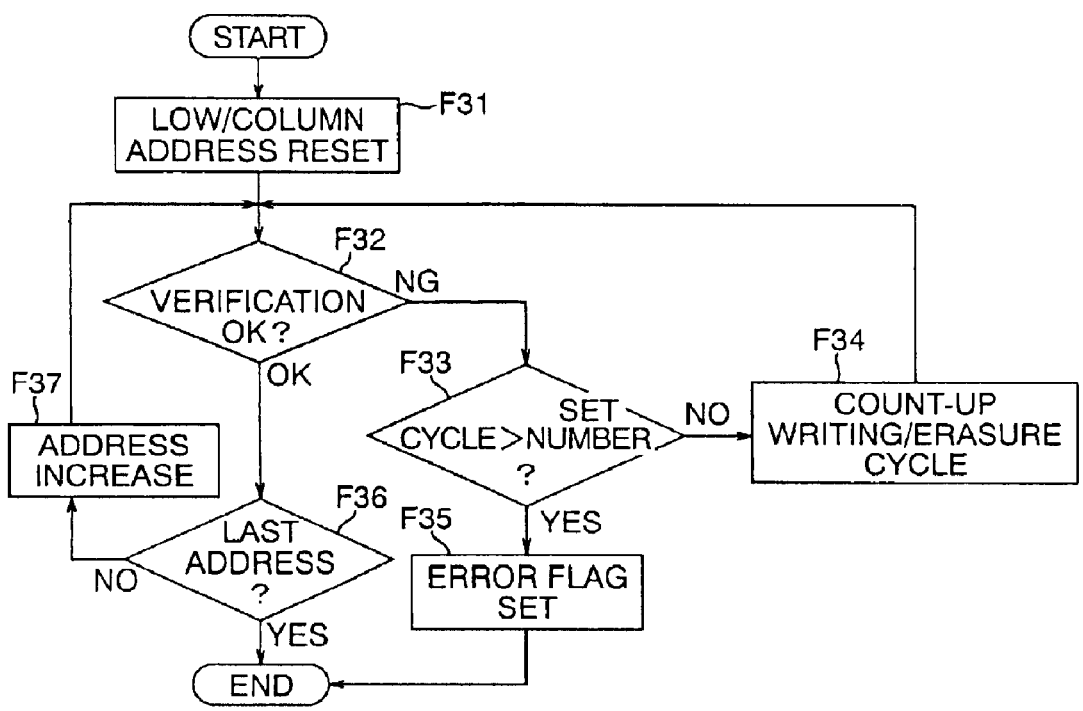
FIG. 10 shows a flowchart indicating an automatic-erasure operation for a semiconductor device according to the fourth embodiment of the present invention.

Disclosed next with reference to FIG. 10 is a semiconductor according to the fourth embodiment of the present invention.

Endless memory-cell writing could occur in the automatic-erasing operation described with reference to FIGS. 5A, 5B and 5C. It will happen particularly at a low level for VFYOK which causes an infinite loop.

The fourth embodiment achieves forced termination of sequence with generation of an error flag for the regular loop repeated more than a set number of time or the duration of sequence over a set time, in accordance with a flowchart shown in FIG. 10.

A row or column address is reset in step F31. It is determined in step F32 whether writing verification or erasure verification is complete. If not, it is determined in step F33 whether the regular loop has been repeated (CYCLE) more than a set number of times. If more than the set times, an error flag is set in step F33, followed by termination of the automatic-erasure operation. If not more than the set times, the number of writing or erasure loop is counted up in step F34, and the procedure returns to step F32.

It is verified again in step F32 whether the regular loop is complete. If the verification shows a positive result (OK), it is determined in step F36 whether the row or column address is the last address. The automatic-erasing operation ends if it is the last address. If not, however, the row or column address is increased in step F37, followed by step F32 to repeat the same procedure described above.

Nevertheless, this embodiment proceeds with writing and erasing operations to all memory cells and redundant cells in a chip in test mode regardless of whether there are defective cells. Termination of automatic-erasing operation when error-flag setting requirements are met causes no writing and erasure testings to be performed to the cells at addresses after the termination of automatic operation.

It is thus available in this embodiment to set the flag VFYOK at a high level when the regular loop has been performed by a particular number of times (or for a particular period), as one of the error-flag setting requirements, to proceed with the sequence, thus achieving automatic-writing and -erasure to all cells regardless of whether there are defective cells. The set flag may be stored for error check after the completion of sequence.

Figure 24:
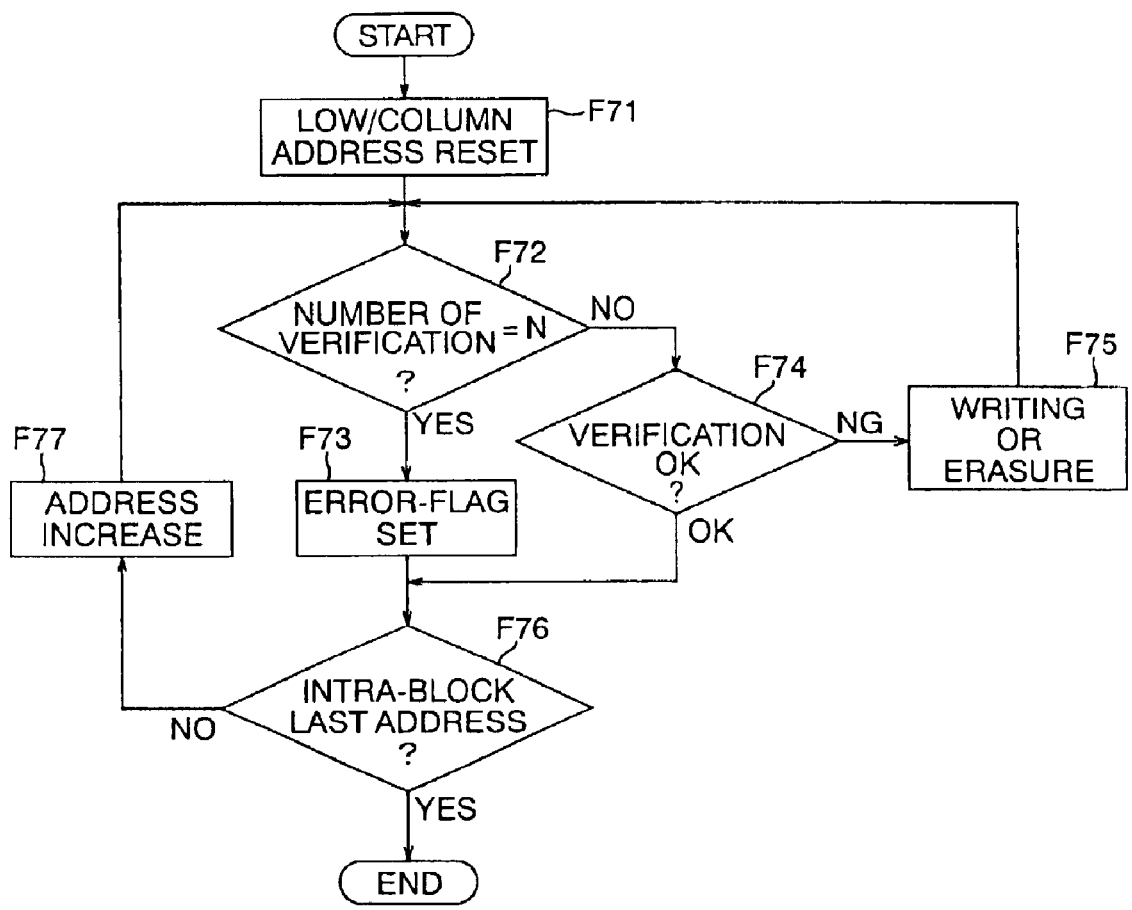
FIG. 24 shows a flowchart indicating an operation of a modification to the fourth embodiment.

FIG. 24 shows a flowchart for automatic-writing/erasure to all memory cells with the flag VFYOK set at the high level when the regular loop has been performed by a particular number of times (or for a particular period) as one of the error-flag setting requirements to proceed with the sequence, regardless of whether there are defective cells.

A row or column address is reset in step F71 in FIG. 24. It is determined in step F72 whether the number of verification for the regular loop has reached a set number N that is a constant or variable by command, etc. An error flag is set in step F73 if the number of verification is N. It is determined in step F77 whether the current address is the last address in a block. The automatic operation ends if it is the last address. If not, the address is increased in step F77. It is determined again in step F72 whether the number of verification has reached the given number N. If not, it is determined in step F74 whether the verification shows a positive result (OK). If not, writing or erasure proceeds in step F75, and the sequence returns to step F72. If the verification shows a positive result in step F74, the sequence returns to step F76.

As disclosed above, writing and erasure are achieved by one sequence for all memory and redundant blocks, thus the fourth embodiment also offers a short test time like the second embodiment.

(Fifth Embodiment)

Figure 11:
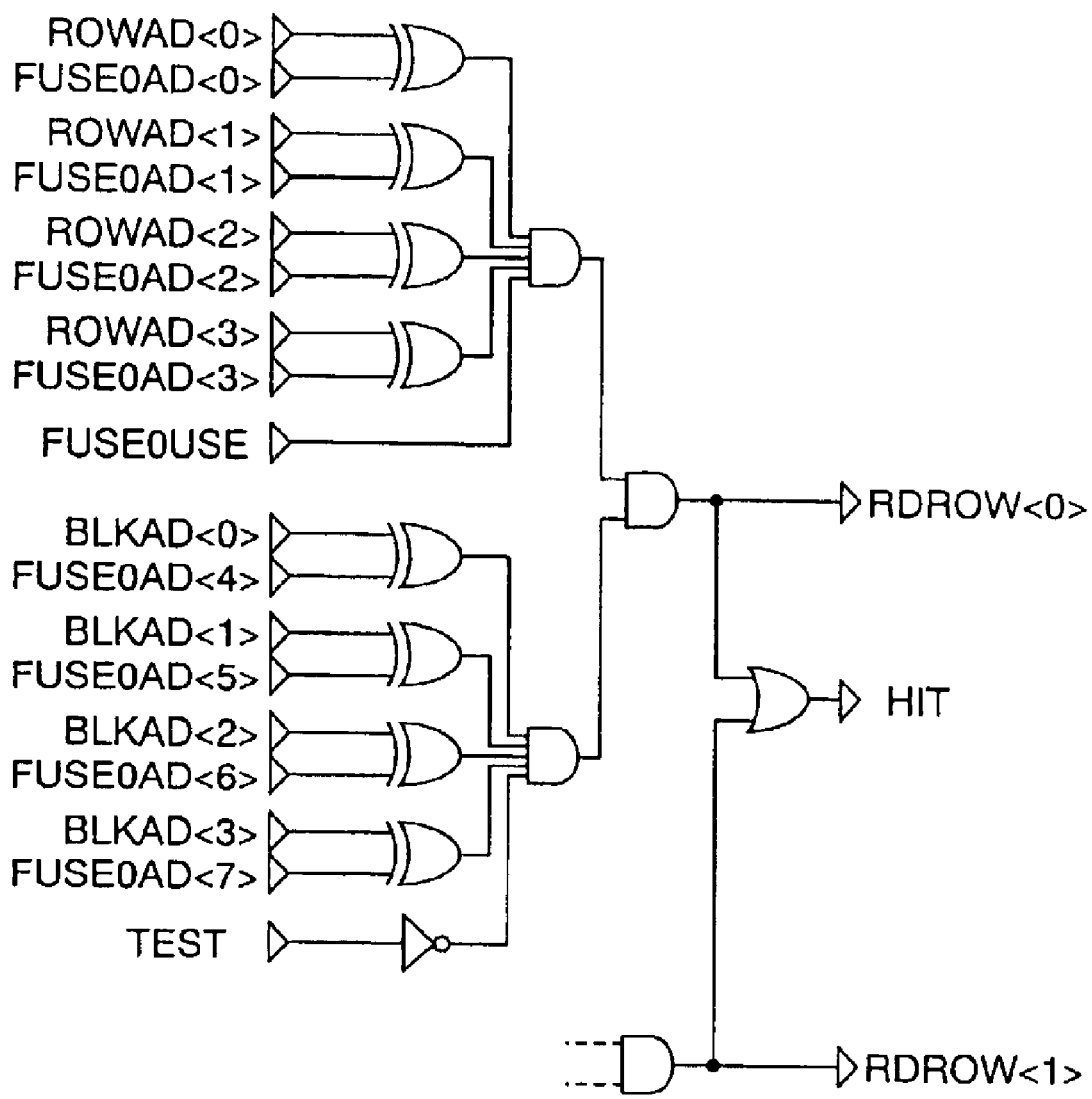
FIG. 11 shows a circuit diagram of redundant-row replacement-decision circuitry in a semiconductor device according to the fifth embodiment of the present invention.

Disclosed next with reference to FIG. 11 is a semiconductor device according to the fifth embodiment of the present invention.

This embodiment allows defective-cell replacements per row or column instead of block. Two redundant rows may, for example, be provided for each block in this embodiment. The row-address controller for such arrangements is the same as those shown in FIGS. 1 or 7. Replacement-address data for defective-cell replacements includes row addresses and also block addresses at which the corresponding word lines exist for the redundant rows in each block. Such block addresses can, however, be neglected in writing/erasure testing to all cells including redundant word lines. This arrangement is achieved with a row-to-redundant block replacement decider 60 shown in FIG. 11 for the memory-to-redundant block replacement decider 26 in the first or the third embodiment, thus block address being neglected in the replacement-address data, and with the set of replacement addresses the same as the number of redundant word lines provided in one block, the replacement addresses each corresponding to a redundant word line being serially stored in a replacement-address memory 28. The other operations in this embodiment are the same as those in the first or the third embodiment.

As disclosed above, this embodiment also achieves writing and erasure by one sequence for all memory and redundant blocks, thus offering a short test time.

(Sixth Embodiment)

Figure 12:
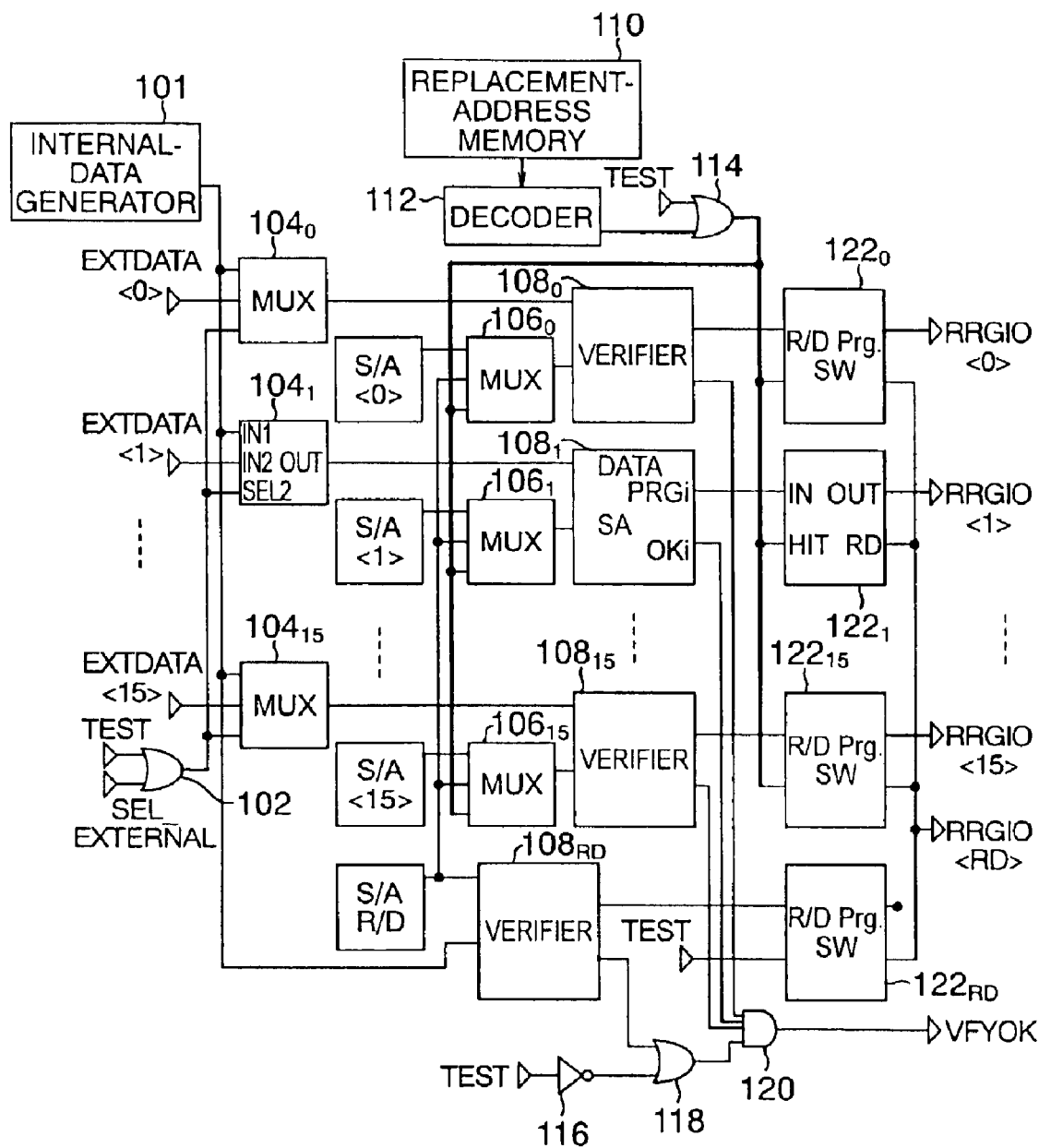
FIG. 12 shows a circuit diagram of write-controller circuitry for I/O-circuitry replacements in a semiconductor device according to the sixth embodiment of the present invention.

Disclosed next with reference to FIG. 12 is a semiconductor device according to the sixth embodiment of the present invention. Shown in FIG. 12 is a writing controller for I/O-circuitry replacements in the sixth embodiment of semiconductor device.

A known semiconductor device is explained with reference to FIG. 18, before disclosing the semiconductor device in the sixth embodiment of semiconductor device, for writing and verification with 1-bit column-redundant circuitry for 16 bit-I/O replacements.

Figure 22A:
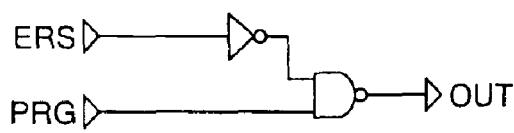
FIGS. 22A and 22B show circuit diagrams of internal-data generator circuitry used in the write-controller circuitry shown in FIG. 18.

Multiplexers $104_0$ to $104_{15}$ select data to be an expected value in verification. In writing, a multiplexer-selection control signal SEL_EXTERNAL is set at a high level so that a multiplexers $104_i$ can select an externally-designated data EXTDATA<i> (i=0, . . . , 15). In erasure, the output of an internal-data generator 101 is selected. The erasure includes a block-writing procedure for writing "0" in all cells in a block and a block-erasing procedure for setting the cells at "1" by erasure. The expected-value data is set at "0" in the block-writing procedure but "0" in the block-erasing procedure by an internal-data generator shown in FIG. 22A.

The expected value for verification selected by the multiplexers $104_0$ to $104_{15}$ is compared with the output of sense amplifiers $SA_0$ to $SA_{15}$ by verifiers $108_0$ to $108_{15}$ as to whether the expected value and the output meet each other (OK) or not (NG) for each I/O. If "OK" to all I/Os, an AND gate 120 generates a high-level verification-pass signal VFYOK for a selected address.

The circuitry having redundant-column circuitry for I/O replacements includes a sense amplifier $SA_R$ for a redundant column. Comparison between the sense-amplifier ($SA_0$ to $SA_{15}$) output and the expected-value data in the verifiers $108_0$ to $108_{15}$ requires replacement of a sense-amplifier ($SA_0$, . . . or $SA_{15}$) output with the sense amplifier ($SA_{RD}$) output when the column is defective. The defective-column sense-amplifier output can be replaced with the output of the sense amplifier $SA_{RD}$ by the multiplexers $104_0$ to $104_{15}$ when the signal decoded by a decoder 112, which is data stored in a replacement-address memory 110, corresponds to the defective column.

Figure 20:
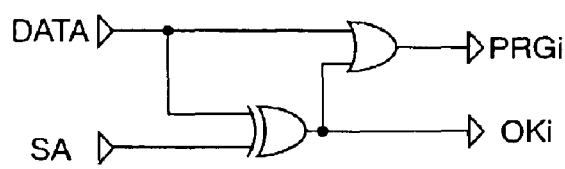
FIG. 20 shows a circuit diagram of verification circuitry used in the writing circuitry shown in FIG. 18.

Each verifier $108_i$ (i=0, . . . , 15) generates a signal $OK_i$ for each I/O when the expected value and the output meet each other (OK) and simultaneously sets data PRGi to be written next. For example, the verifier decider $108_i$ includes a verification circuit shown in FIG. 20 in which the data PRGi is set at a high level when the verification shows a positive result, or the signal $OK_i$ is at a high level, thus no data "0" being written.

Figure 21:
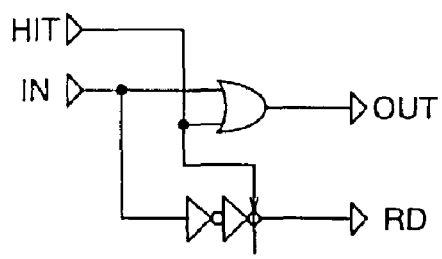
FIG. 21 shows a circuit diagram of data-to-be-written switching circuitry used in the write-controller circuitry shown in FIG. 18.

In supplying data to cells, a writing operation is performed not to a defective column but a redundant column, which is achieved by switches $122_0$ to $122_{15}$ that switch data to be written for supplying data to a redundant cell, not a memory cell, for I/O that meets data in the replacement-address memory 110. Each of the switches $122_0$ to $122_{15}$ may be made up of a circuit shown in FIG. 21.

A redundant-block use instruction signal HIT is set at a low level for I/Os that do not meet any data in the replacement-address memory 110, thus data to be written designated by the verifier $108_0$ to $108_{15}$ is transferred to a redundant cell. In contrast, the signal HIT is set at a high level for a defective I/O, thus data being set at "1" (OUT= "HIGH") in memory cells, hence no data being supplied to the memory cells, instead, the data to be written being transferred as PRGIO <RD> to and written in the redundant cell.

Figure 22B:
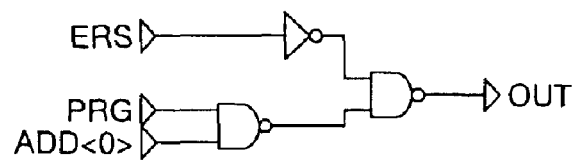

The internal-data generator 101 may be made up of a logic circuit shown in FIG. 22B for writing several types of specific pattern data to cells in test mode, such as, a pattern of "1" and "0" depending on a parity of the least significant bit (ADD<0>). The internal-data generator 101 may be provided per I/O for automatically writing cell data, for each I/O, of patterns except uniform patterns of data "0" or "1" only.

Figure 18:
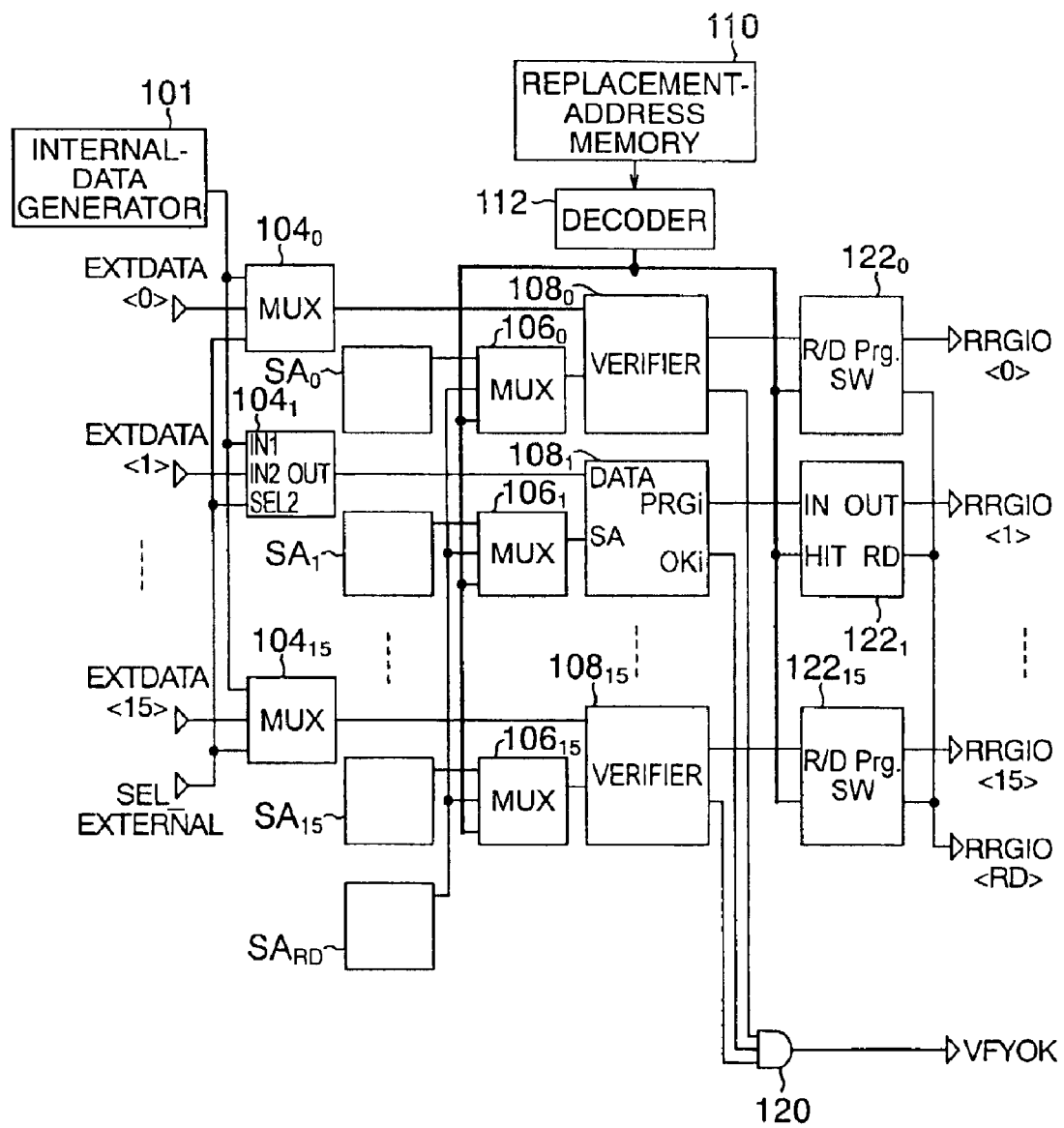
FIG. 18 shows a circuit diagram of writing-circuitry for I/O replacements in another known semiconductor device.
Figure 19:
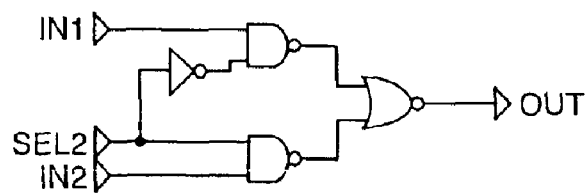
FIG. 19 shows a circuit diagram of multiplexer used in the write-controller circuitry shown in FIG. 18.

The known semiconductor device shown in FIG. 18 is not available for writing to all cells including redundant (R/D) columns via verifier because the redundant columns are always used for defective-cell replacements.

Such a function is achieved with the sixth embodiment shown in FIG. 12.

The sixth embodiment in FIG. 12 is provided with a verifier $108_{RD}$ for R/D columns and a switch $122_{RD}$ for data to be written, in addition to the circuit components the same as shown in FIG. 18. Switches $122_0$ to $122_{16}$ for replacements with R/D columns are inhibited from use in test mode.

The output of an internal-data generator 101 only is used as an expected value in verification. An expected-value data is set at an expected value in multiplexers $104_0$ to $104_{15}$ via an OR gate 102. All signals HIT for replacements are set at a low level via an OR gate 114 to inhibit R/D-column replacements for expected value in verification and data to be written. A signal OKi indicating a result of verification for R/D columns is supplied to an AND gate 120, which requires to be positive for verification on a selected address.

In regular operation (TEST="LOW"), replacements are allowed while the outputs of the verifier $108_{RD}$ for the R/D column and the switch $122_{RD}$ for data to be written are set at a certain level. In detail, replacement data is supplied to a R/D cell while a verification-result signal OKi from the verifier $108_{RD}$ and the output of the switch $122_{RD}$ are being set a high level.

This embodiment also achieves writing and erasure by one sequence for all blocks including the redundant block, thus offering a short test time.

Disclosed further with respect to FIG. 12 is writing and verification with redundant-column circuitry in I/O replacements.

FIG. 12 shows a block diagram of a semiconductor having 1-bit redundant circuitry for 1-bit I/O. The multiplexers $104_0$ to $104_{15}$ select data to be an expected value in verification. In writing, a multiplexer-selection control signal SEL_EXTERNAL is set at a high level so that a multiplexers $104_i$ can select an externally-designated data EXTDATA<i> (i=0, . . . , 15). In erasure, the output of the internal-data generator 101 is selected. The erasure includes a block-writing procedure for writing "0" in all cells in a block and a block-erasing procedure for setting the cells at "1" by erasure. The expected-value data is set at "0" in the block-writing procedure but "0" in the block-erasing procedure by an internal-data generator shown in FIG. 22A.

The expected value for verification selected by the multiplexers $104_0$ to $104_{15}$ is compared with the output of the sense amplifiers $SA_0$ to $SA_{15}$ by the verifiers $108_0$ to $108_{15}$ as to whether the expected value and the output meet each other (OK) or not (NG) for each I/O. If "OK" to all I/Os, the AND gate 120 generates a high-level verification-pass signal VFYOK for a selected address.

The circuitry having redundant-column circuitry for I/O replacements includes a sense amplifier $SA_{RD}$ for a redundant column. Comparison between the sense-amplifier ($SA_0$ to $SA_{15}$) output and the expected-value data in the verifiers $108_0$ to $108_{15}$ requires replacement of a sense-amplifier $SA_0$, . . . or $SA_{15}$) output with the sense amplifier ($SA_{RD}$) output when a column is defective. The defective-column sense-amplifier output can be replaced with the output of the sense amplifier $SA_{RD}$ by the multiplexers $104_0$ to $104_{15}$ when the signal decoded by a decoder 112, which is data stored in a replacement-address memory 110, corresponds to a defective column.

Each verifier $108_i$ (i=0, . . . , 15) generates a signal $OK_i$ for each I/O when the expected value and the output meet each other (OK) and simultaneously sets data PRGi to be written next. For example, the verifier $108_i$ includes a verification-decision circuit shown in FIG. 20 in which the data PRGi is set at a high level when the verification shows a positive result, or the signal $OK_i$ is at a high level, thus no data "0" being written.

In supplying data to cells, a writing operation is performed not to a defective column but a redundant column, which is achieved by switches $122_0$ to $122_{15}$ that switch data to be written for supplying data to a redundant cell, not a memory cell, for I/O that meets data in the replacement-address memory 110. Each of the switches $122_0$ to $122_{15}$ may be made up of a circuit shown in FIG. 21.

A redundant-block use instruction signal HIT is set at a low level for I/Os that do not meet any data in the replacement-address memory 110, thus data to be written designated by the verifier $108_0$ to $108_{15}$ is transferred to a redundant cell. In contrast, the signal HIT is set at a high level for a defective I/O, thus data being set at "1" (OUT= "HIGH") in memory cells, hence no data being supplied to the memory cells, instead, the data to be written being transferred as PRGIO <RD> to and written in the redundant cell.

The internal-data generator 101 may be made up of a logic circuit shown in FIG. 22B for writing several types of specific pattern data to cells in test mode, such as, a pattern of "1" and "0" depending on a parity of the least significant bit (ADD<0>). The internal-data generator 101 may be provided per I/O for automatically writing cell data, for each I/O, of patterns except uniform patterns of data "0" or "1" only.

In test mode (TEST="HIGH"), the redundant-column replacement logic is set at a disable state, so that PRG10<RD> is not decided by the outputs of the switches $122_0$ to $122_{15}$ but via the verifier $108_{RD}$ for the R/D column and the switch $122_{RD}$ for data to be written.

The operation in test mode (TEST="HIGH") is disclosed with reference to FIG. 12.

The output of the internal-data generator 101 only is used as an expected value in verification at TEST=HIGH. The multiplexers $104_0$ to $104_{15}$ are set via the AND gate 102 to accept the output of the internal-data generator 101. All signals HIT for replacements are set at a low level via an OR gate 114 to inhibit replacements with the R/D column for expected value in verification and data to be written. A verification-decision signal VFYOK for a selected address is generated based on the outputs of the verifier $108_{RD}$ in addition to the outputs of the verifiers $108_0$ to $108_{15}$ for I/Os.

This operation allows a redundant column to be selected as if the 17th I/O. The same redundant column could, however, be inevitably selected several times when data are written in a cell array at all addresses selected in succession. This is avoided by changing the logic states in the switch $122_{RD}$ and the AND gate 118 so that these components will be in an enable state only when a redundant column to be tested is selected first.

Figure 25:
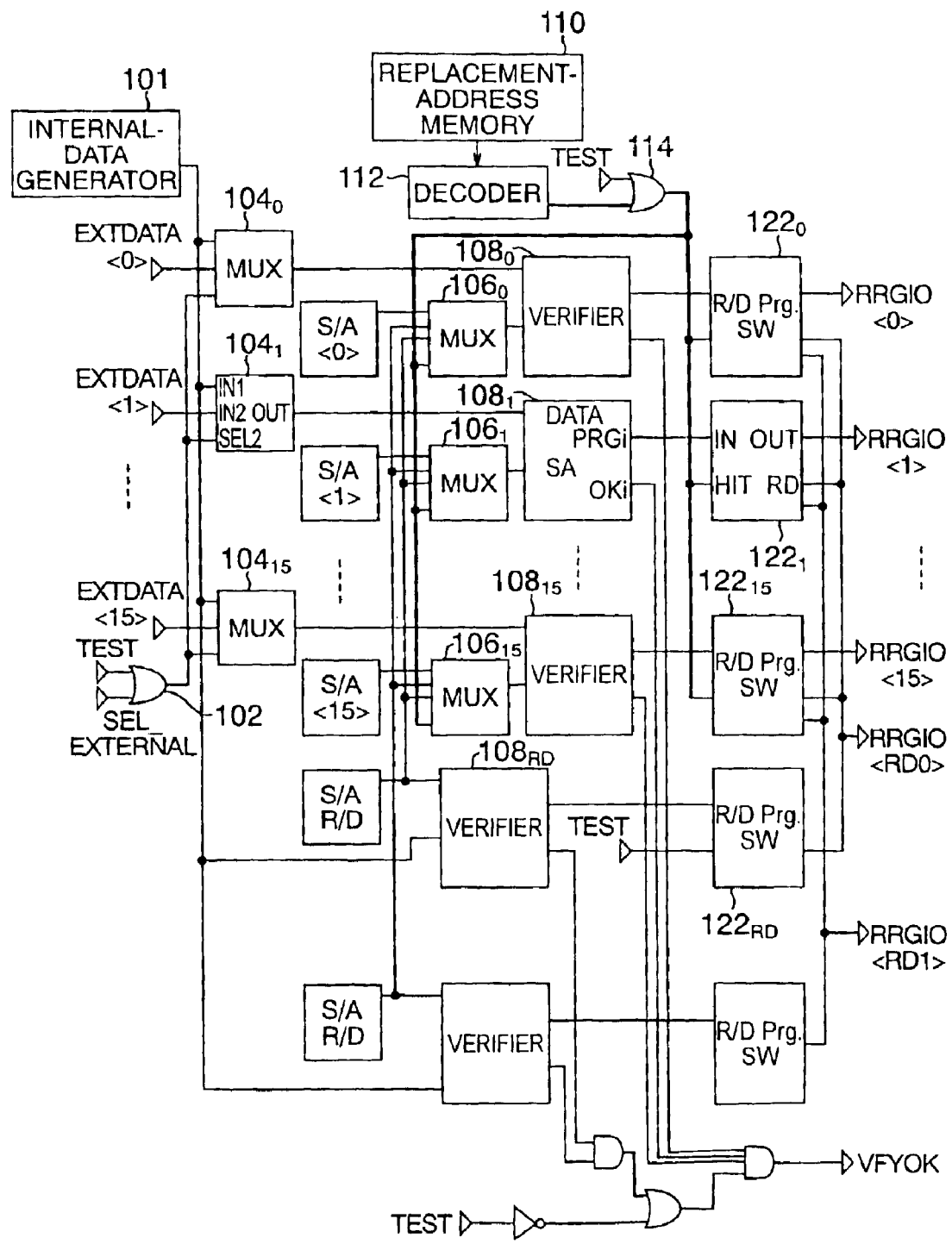
FIG. 25 shows a block diagram of a modification to the sixth embodiment.

The embodiment shown in FIG. 12 is provided with single I/O for replacements, which can, however, be modified like shown in FIG. 25 with several I/Os such as two I/Os for replacements.

As disclosed above, the present invention achieves writing and erasure by one sequence for all blocks including redundant blocks, thus offering a short test time.

What is claimed is:

1. A semiconductor device comprising:
   an address counter to output, in a first mode, a first block address selected from a first block-address space corresponding to a plurality of memory blocks, the memory blocks and at least one redundant block being included in a memory section, whereas, in a second mode, a second block address selected from a second block-address space two times larger than the first block-address space;
   a memory to store addresses of the memory blocks and an address of the redundant block with which any one of the memory blocks is to be replaced when defective;
   a memory-to-redundant block replacement decider to output an agreement signal when an output of the address counter and an address of the redundant block stored in the memory are equal to each other; and
   a block-selection controller to select, in the second mode, one of the memory blocks, which corresponds to the output of the address counter, when a most significant value of the second block address as the output of the address counter is at a first level whereas select the redundant block while the memory blocks are inhibited from selection, when the most significant value is at a second level, and in the first mode, select one of the memory blocks, which corresponds to the output of the address counter, when the agreement signal is not output from the memory-to-redundant block replacement decider whereas select the redundant block with which one of the memory blocks, which corresponds to the output of the address counter, is to be replaced based on the output of the memory, while the memory blocks are inhibited from selection, when the agreement signal is output from the memory-to-redundant block replacement decider.

2. The semiconductor device according to claim 1, wherein the address counter outputs the first or the second block address in accordance with a total number of pulses of an input address count-up signal.

3. The semiconductor device according to claim 1, wherein the memory includes a first non-volatile memory and a second volatile memory, both for storing the addresses of the memory blocks, the memory-to-redundant block replacement decider selecting either the first or the second memory, for outputting the agreement signal.

4. The semiconductor device according to claim 1, wherein the memory includes at least one non-volatile memory cell in which the addresses of the memory blocks are allowed to be written.

5. The semiconductor device according to claim 1, wherein the memory stores data of serial addresses of redundant cells of the redundant block, further comprising a last-block decider to output, in the first mode, a completion signal when a last address for memory cells of the memory blocks is designated whereas output the completion signal, in the second mode, when a last address for the redundant cells is designated, in selection of the memory cells in succession designated by the output of the address counter.

6. The semiconductor device according to claim 1 further comprising a last-block decider to output, in the first mode, a completion signal when a last address for memory cells is designated whereas output the completion signal, in the second mode, when all addresses in the block-address spaces are designated in selection of the memory cells in succession designated by the output of the address counter.

7. The semiconductor device according to claim 1 further comprising an automated-operation controller to select one of the memory blocks or the redundant block to perform a writing procedure or an erasing procedure to a selected block, the procedure automatically terminating when the procedure is complete for all of the blocks.

8. The semiconductor device according to claim 7, wherein the automated-operation controller includes means for writing a specific pattern to all of the blocks, the pattern having data inverted in accordance with a parity of each address.

9. The semiconductor device according to claim 7, wherein the automated-operation controller performs the writing or the erasing procedure to each block, followed by verification, selects a next block address when the verification shows a positive result whereas performs again the writing or the procedure to each block, and in the second mode, selects the next block address when the verification shows a negative result a specific number of times or more for a memory cell of any of the memory blocks.

10. A semiconductor device comprising:
    a plurality of memory columns connected to at least one memory cell and at least one redundant column;
    a memory to store information on which memory column has been replaced with the redundant column;
    a plurality of sense amplifiers each sensing data in a selected memory column and in the redundant column;
    a comparator to compare a sensed output and a cell-data expected value for each sense amplifier; and
    a verifier to, in regular mode, replace an output of the sense amplifier for one of the memory columns designated based on information stored in the memory with an output of the sense amplifier for the redundant column and compare the output of the sense amplifier for the redundant column with a reference level whereas, in test mode, compare outputs of the sense amplifiers for the memory columns and also the output of the sense amplifier for the redundant column with the reference level irrespective of the information stored in the memory.

11. The semiconductor device according to claim 10, wherein a next address is selected when verification to a previous address shows a negative result a specific number of times or more.

* * * * *